(12) United States Patent
Yagishita

(10) Patent No.: US 7,314,787 B2
(45) Date of Patent: Jan. 1, 2008

(54) METHOD OF MANUFACTURING A SEMICONDUCTOR DEVICE

(75) Inventor: Atsushi Yagishita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 53 days.

(21) Appl. No.: 11/058,190

(22) Filed: Feb. 16, 2005

(65) Prior Publication Data
US 2005/0202618 A1    Sep. 15, 2005

(30) Foreign Application Priority Data
Mar. 10, 2004  (JP) .............................. 2004-067253
May 20, 2004  (JP) .............................. 2004-150519

(51) Int. Cl.
*H01L 21/336* (2006.01)

(52) U.S. Cl. ...................... 438/197; 438/595; 257/350; 257/401

(58) Field of Classification Search ................ 438/151, 438/197, 241, 258, 283, 595, 445; 257/270, 257/750, 288, 350, 401, E51.005, E27.099, 257/E31.085, E27.06, E29.04
See application file for complete search history.

(56) References Cited

U.S. PATENT DOCUMENTS

| 5,045,903 | A | * | 9/1991 | Meyer et al. ................ 257/339 |
| 5,554,888 | A | * | 9/1996 | Kato ........................... 257/750 |
| 5,804,848 | A | * | 9/1998 | Mukai ........................ 257/270 |
| 6,284,613 | B1 | * | 9/2001 | Subrahmanyam et al. .. 438/307 |
| 6,624,473 | B1 | * | 9/2003 | Takehashi et al. .......... 257/344 |

OTHER PUBLICATIONS

Y. Choi et al., "A Spacer Patterning Technology for Nanoscale CMOS", IEEE Transactions on Electron Devices, vol. 49, No. 3, pp. 436-441, (Mar. 2002).

* cited by examiner

*Primary Examiner*—Thao P. Le
(74) *Attorney, Agent, or Firm*—Finnegan, Henderson, Farabow, Garrett & Dunner, L.L.P.

(57) ABSTRACT

A manufacturing method of a semiconductor device disclosed herein comprises: forming a convex first protrusion; forming a first film, of which a surface is higher than the first protrusion; forming a mask portion on the first film; and etching the first film with the mask portion as a mask.

14 Claims, 31 Drawing Sheets

METHOD OF MANUFACTURING A SEMICONDUCTOR DEVICE

CROSS REFERENCE TO RELATED APPLICATION

This application claims benefit of priority under 35 U.S.C.§119 to Japanese Patent Applications No. 2004-67253, filed on Mar. 10, 2004, and No. 2004-150519, filed on May 20, 2004 the entire contents of which are incorporated by reference herein.

BACKGROUND OF THE INVENTION

1. Field of the Invention

The present invention relates to a semiconductor device and a manufacturing method of the same.

2. Related Background Art

In a semiconductor device including two or more kinds of convex protrusions, it is sometimes wished to leave a sidewall material to form a sidewall only on a side surface of a part of the protrusions. An FinFET in FIG. 1 shows an example of a semiconductor device in which whether to form a sidewall or not depends on each protrusion.

In the semiconductor device shown in FIG. 1, provided on a buried insulating film 8 formed from a BOX (Buried Oxide) are a gate electrode 10 as a second protrusion and a Fin 12 as a first protrusion which becomes a source/drain. On the upper side of the gate electrode 10, a SiN hard mask 11 is provided, and on the upper side of the Fin 12, a SiN hard mask 13 is provided.

However, when a side wall is formed in a sidewall-leaving process, there is a problem that sidewalls are formed on all of the protrusions. Namely, in the semiconductor device shown in FIG. 1, as shown in FIG. 2, it is necessary to form a sidewall 14 on a sidewall portion of the gate electrode 10. However, when the sidewall 14 is formed in the gate electrode 10, a sidewall 16 is inevitably formed also in the Fin 12.

If the sidewall 16 is formed in the Fin 12, when ion implantation into the Fin 12 is performed to form source/drain regions in the Fin 12, ion implantation from the sidewall of the Fin 12 cannot be performed. Hence, ion implantation is performed from above the Fin 12.

FIG. 3 is a sectional view taken along the line A-A' in FIG. 2. As shown in FIG. 3, if ion implantation into the Fin 12 is performed from above, source/drain regions 18 which are uniform in a depth direction of the Fin 12 cannot be formed. If the source/drain regions 18 uniform in the depth direction cannot be formed, a distance L1 between the source region and the drain region in an upper portion of the Fin 12 and a distance L2 between the source region and the drain region in a lower portion of the Fin 12 become different. Moreover, a high parasitic resistance R occurs in the source/drain regions 18 in the lower portion of the Fin 12. Therefore, there arises a problem that transistor drive capability deteriorates.

However, when the sidewall 14 is not formed, if thermal diffusion is performed after ion implantation is performed to form the source/drain regions 18 in the Fin 12, there arises a problem that the source/drain regions 18 are united to each other. Moreover, if the sidewall 14 is not formed, there is another problem that when silicide 19 is formed in the upper portions of the source/drain regions 18, the silicide 19 formed in the source/drain regions 18 and silicide formed in the gate electrode 10 are united.

Furthermore, the technology of forming a pattern which is finer than the limit of photolithography by using the sidewall formed in the sidewall-leaving process as an etching pattern is known. Such a process is called a sidewall pattern transfer process, and, for example, disclosed in Yang-Kyu Choi, Tsu-Jae King, Chenming Hu, "A Spacer Patterning Technology for Nanoscale CMOS", IEEE Transactions on Electron Devices, Vol. 49, No. 3, March 2002, pp. 436-441 (Document 1).

SUMMARY OF THE INVENTION

In order to accomplish the aforementioned and other objects, according to one aspect of the present invention, a manufacturing method of a semiconductor device, comprises:

forming a convex first protrusion;
forming a first film, of which a surface is higher than the first protrusion;
forming a mask portion on the first film; and
etching the first film with the mask portion as a mask According to another aspect of the present invention, a semiconductor device, comprises:

a convex semiconductor portion, a source region being formed on one side of the convex semiconductor portion and a drain region being formed on the other side of the convex semiconductor portion;
a gate electrode which is formed on the convex semiconductor portion between the source region and the drain region via a gate insulating film;
a lower sidewall which is formed on a lower side of a sidewall portion of the gate electrode; and
an upper sidewall which is formed on the lower sidewall in the sidewall portion of the gate electrode and which is formed of a material different from a material forming the lower sidewall.

DETAILED DESCRIPTION OF THE EMBODIMENTS

First Embodiment

Figure 1:
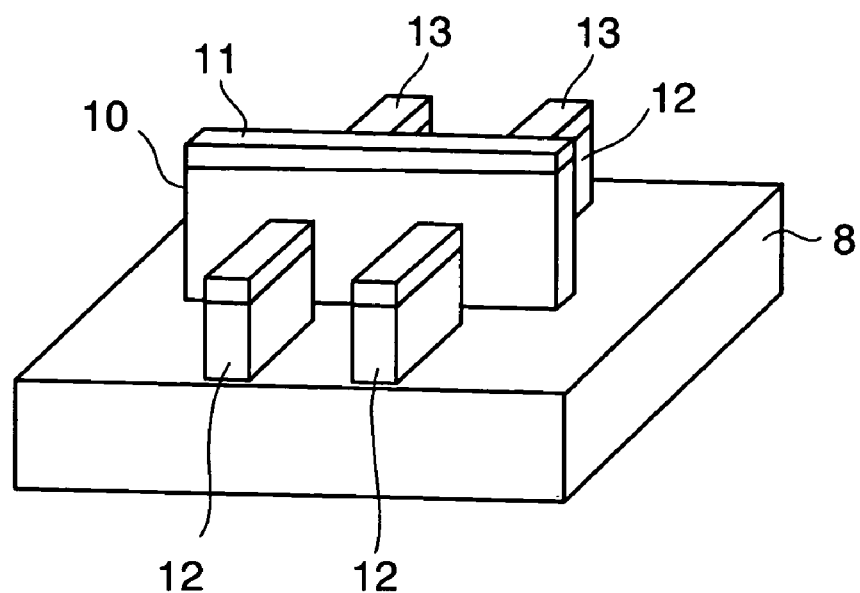
FIG. 1 is a sectional view for explaining a manufacturing process of a related FinFET.
Figure 2:
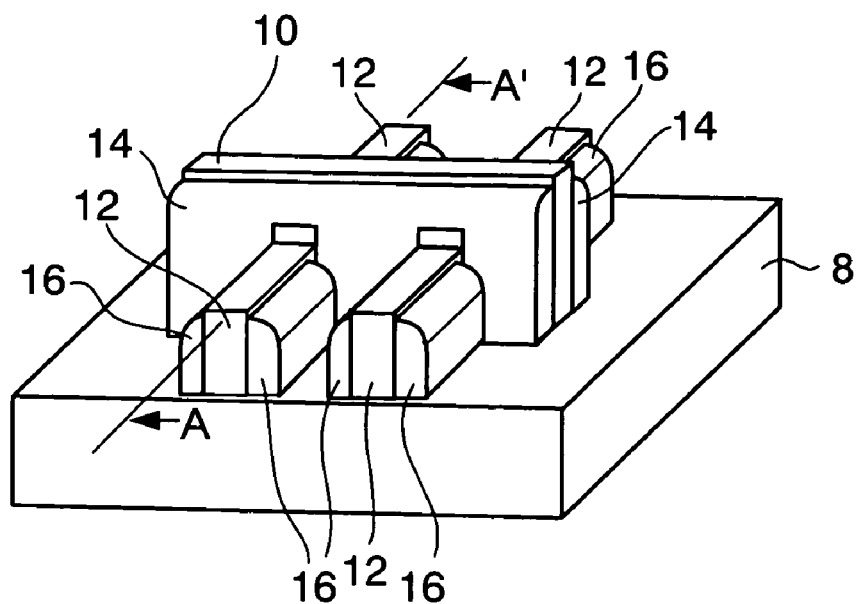
FIG. 2 is a sectional view for explaining the manufacturing process of the related FinFET.
Figure 3:
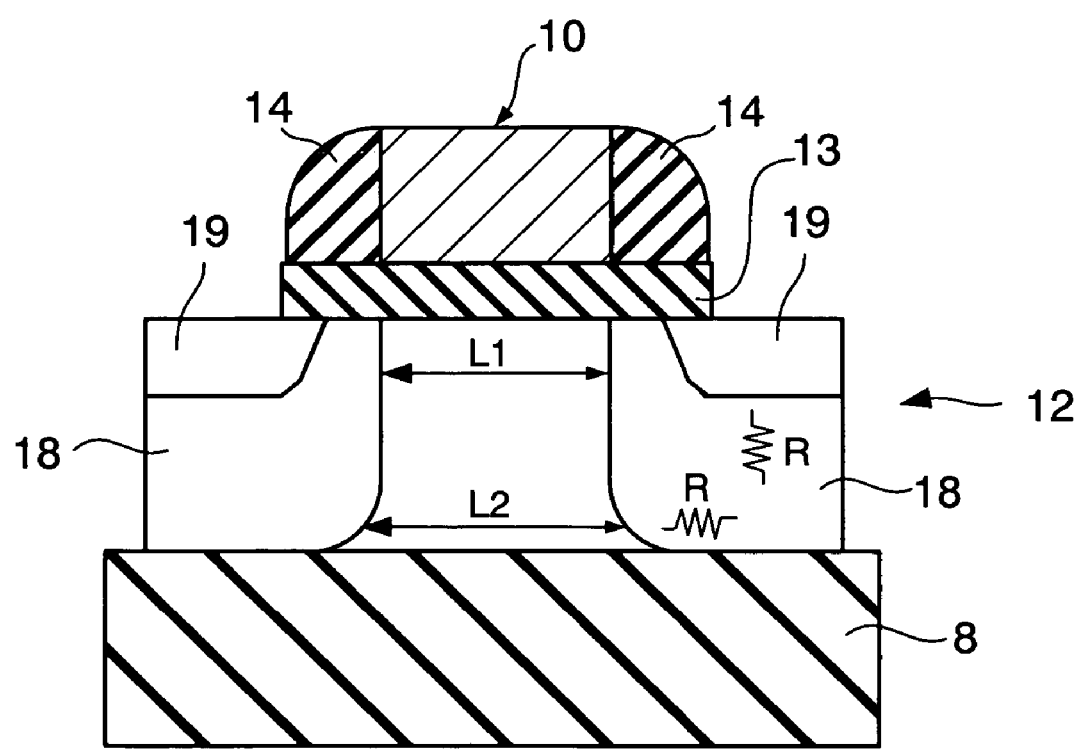
FIG. 3 is a sectional view taken along the line A-A' in FIG. 2.
Figure 4:
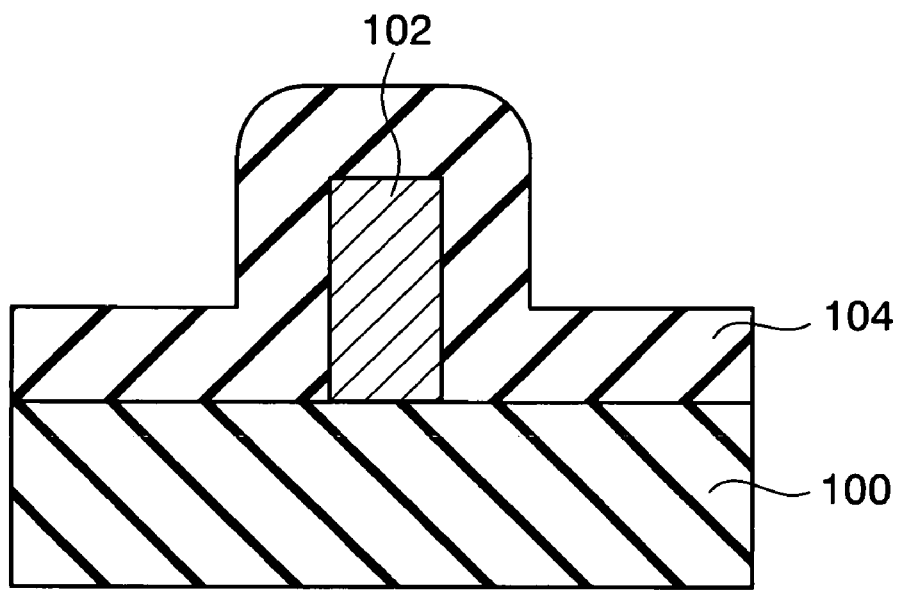
FIG. 4 is a sectional view for explaining a process of forming a sidewall on a sidewall portion of a protrusion by a sidewall-leaving process.
Figure 5:
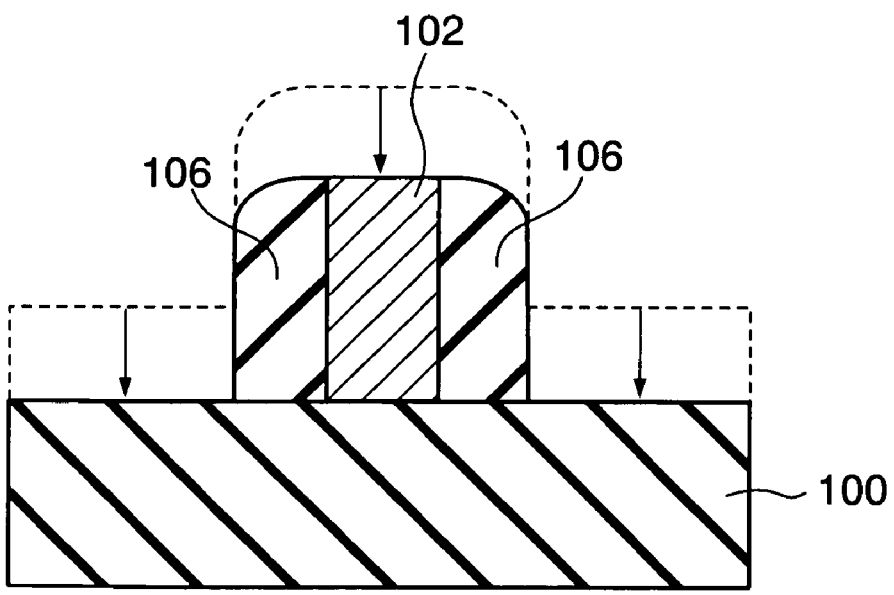
FIG. 5 is a sectional view for explaining the process of forming the sidewall on the sidewall portion of the protrusion by the sidewall-leaving process.
Figure 6:
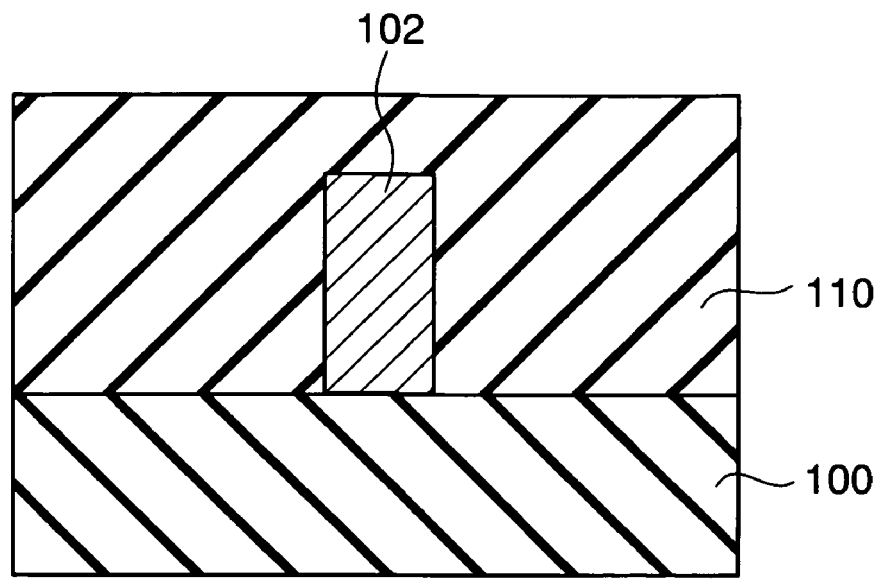
FIG. 6 is a sectional view for explaining an etching process in which no sidewall is formed on the sidewall portion of the protrusion.

First, the basic concept of the present invention will be explained with the first embodiment as an example. As shown in FIG. 4, a convex protrusion 102 is formed on a buried insulating film 100. This protrusion 102 is a device component in this embodiment. Subsequently, a film 104 with a uniform thickness thinner than the height of the protrusion 102 is formed thereon. Note that the film 104 need not necessarily have a film thickness thinner than the height of the protrusion 102. Then, overall anisotropic etching is performed by only an amount corresponding to the thickness of the film 104. Consequently, as shown in FIG. 5, a material for the film 104 remains on a sidewall portion of the protrusion 102, and thereby a sidewall 106 is formed.

Figure 7:
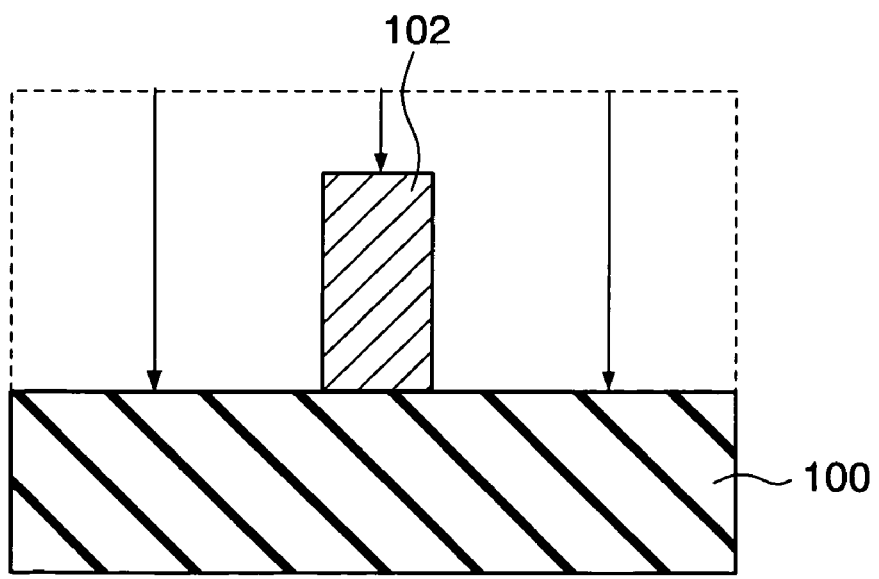
FIG. 7 is a sectional view for explaining the etching process in which no sidewall is formed on the sidewall portion of the protrusion.

In contrast, a film 110 with a thickness thicker than the height of the protrusion 102 is formed on the buried insulating film 100 on which the protrusion 102 is formed. Namely, the film 110 is formed in such a manner that the surface of the film 110 is located at a position higher than the protrusion 102. Thereafter, the film 110 is planarized. Then, overall anisotropic etching is performed by only an amount corresponding to the thickness of the film 110 on the insulating film 100. Consequently, as shown in FIG. 7, the film 110 does not remain on the sidewall portion of the protrusion 102, so that no sidewall is formed. In this embodiment, this property is applied.

Figure 8:
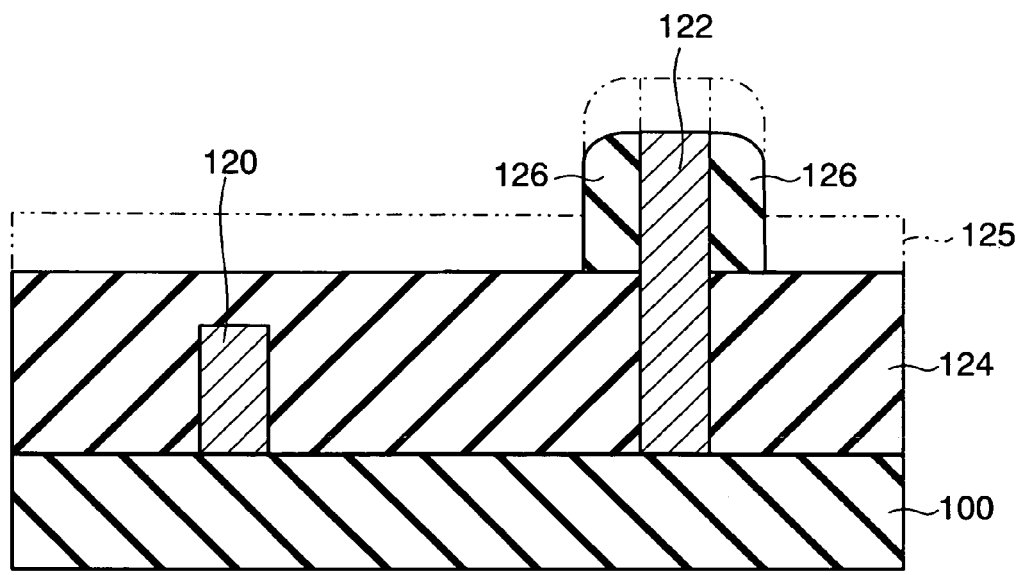
FIG. 8 is a sectional view for explaining a manufacturing process of a semiconductor device in a first embodiment.
Figure 9:
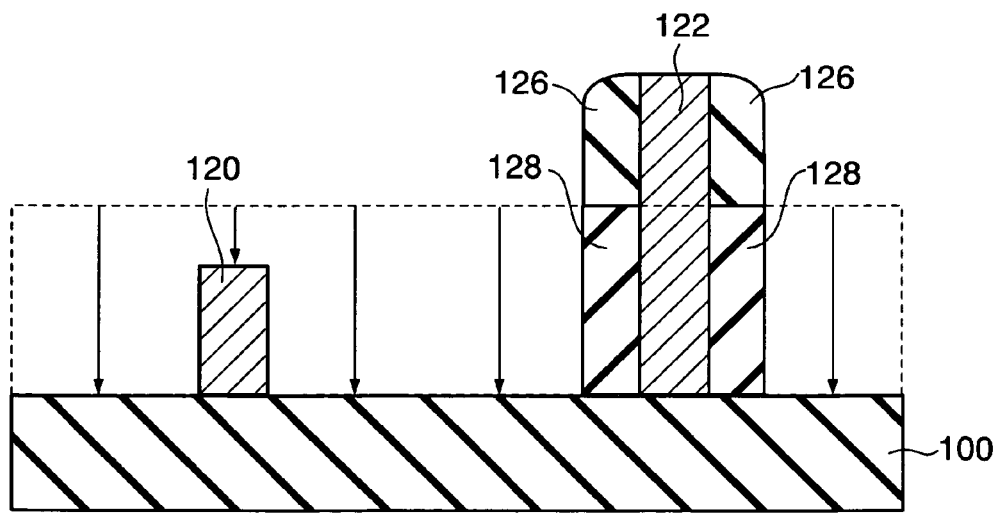
FIG. 9 is a sectional view for explaining the manufacturing process of the semiconductor device in the first embodiment.

FIG. 8 and FIG. 9 are process sectional views for explaining a manufacturing method of a semiconductor device according to this embodiment. As shown in FIG. 8, a first protrusion 120 and a second protrusion 122 are formed on the buried insulating film 100. Note that the second protrusion 122 is formed higher than the first protrusion 120. These first protrusion 120 and second protrusion 122 are examples of device components in this embodiment.

Next, a first film 124 is formed overall thereon, planarized, and etched back. Note that the thickness of the first film 124 after the etch back is thicker than the height of the first protrusion 120 and thinner than the height of the second protrusion 122. In other words, the surface of the first film 124 is located at a position higher than the first protrusion 120 and lower than the second protrusion 122. Accordingly, a top of the first protrusion 120 does not protrude from the first film 124, whereas a top of the second protrusion 122 protrudes from the surface of the first film 124.

Then, a second film 125 is formed overall and subjected to overall anisotropic etching, and thereby a first sidewall 126 is formed from the second film 125 remaining on a sidewall portion of the second protrusion 122. To prevent the first film 124 from being etched at the time of this overall anisotropic etching, it is desirable to select a material having a higher etching selective ratio than a material for the first film as a material for the second film 125. This first sidewall 126 corresponds to a mask portion in this embodiment.

Thereafter, as shown in FIG. 9, with the first sidewall 126 as a mask, the first film 124 is subjected to anisotropic etching. As a result, on a side surface portion of the second protrusion 122, the first film 124 remains and thereby a second sidewall 128 is formed. However, on a side surface portion of the first protrusion 120, the first film 124 does not remain and hence no sidewall is formed.

As described above, according to the manufacturing method of the semiconductor device according to this embodiment, the sidewalls 126 and 128 are formed only on the side surface portion of the higher protrusion 122, and no sidewall is formed on the side surface portion of the lower protrusion 120. Therefore, in a semiconductor device including two or more kinds of protrusions as device components, a sidewall can be formed only on a side surface portion of a specific protrusion. Namely, it becomes possible to cover and protect only the side surface portion of the specific protrusion with the sidewall.

This means that a side surface of a protrusion other than the specific protrusion can be exposed and subjected to a variety of fabrication processing in the subsequent processes.

Second Embodiment

In the second embodiment, the aforementioned first embodiment is applied to a FinFET which is an example of a convex semiconductor portion. A more detailed explanation will be given below.

Figure 10:
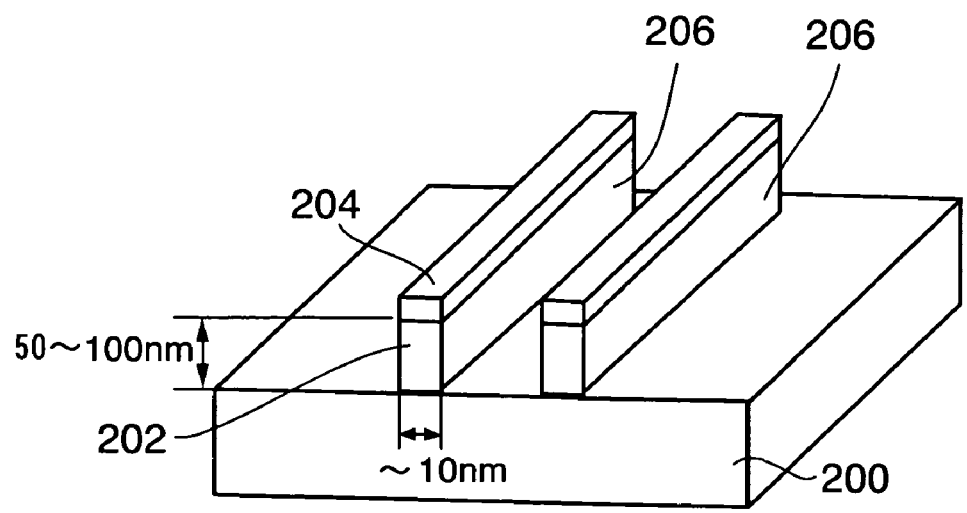
FIG. 10 is a sectional view for explaining a manufacturing process of a semiconductor device in a second embodiment.

FIG. 10 to FIG. 20 are sectional views for explaining a manufacturing process of a semiconductor device according to this embodiment. As shown in FIG. 10, an SOI substrate with an SOI thickness of approximately 50 nm to 100 nm is prepared. In this embodiment, the SOI substrate in which a BOX (Buried Oxide) is used as a buried insulating film 200 on a semiconductor substrate and a silicon film 202 with a thickness of 50 nm to 100 nm is formed thereon is prepared. Subsequently, a SiN hard mask 204 with a thickness of approximately 70 nm is formed and subjected to patterning and RIE to thereby form two Fins 206. In this embodiment, the width of this Fin 206 is approximately 10 nm.

Figure 11:
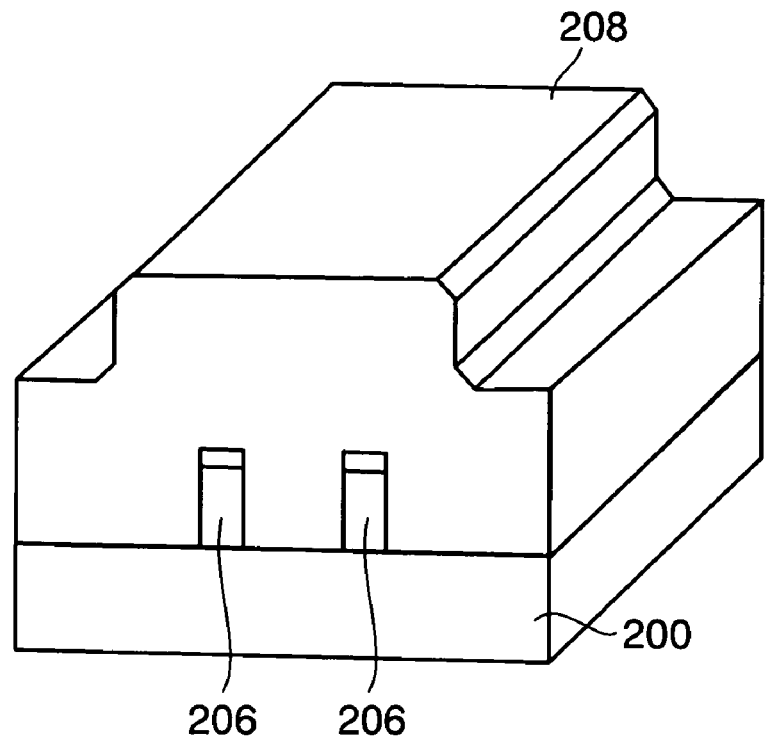
FIG. 11 is a sectional view for explaining the manufacturing process of the semiconductor device in the second embodiment.

Then, as shown in FIG. 11, after a gate insulating film (not shown) is formed on side surfaces of the Fins 206, a first-layer gate polysilicon 208 is formed. In this embodiment, this gate polysilicon 208 is formed so as to have a film thickness of approximately 300 nm. Since this gate polysilicon 208 is formed on steps of the Fins 206, a large step is formed on the surface thereof.

Figure 12:
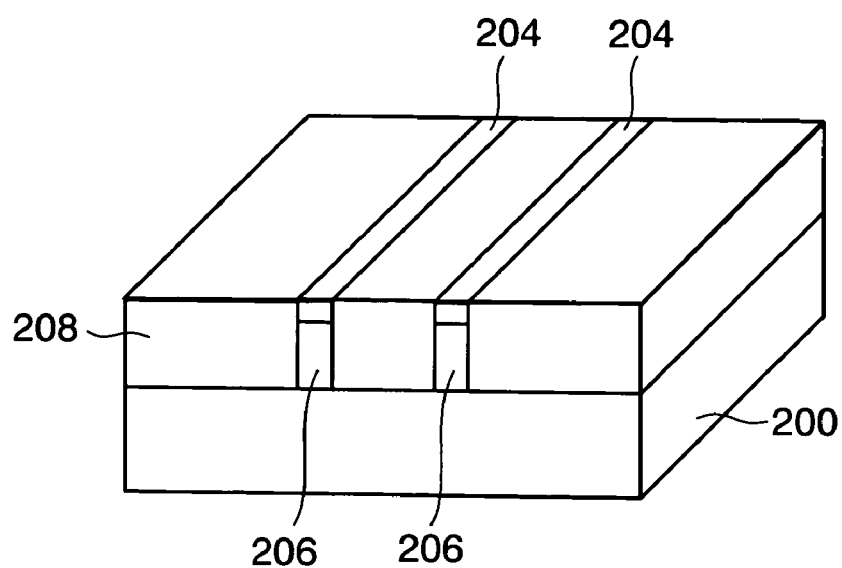
FIG. 12 is a sectional view for explaining the manufacturing process of the semiconductor device in the second embodiment.
Figure 13:
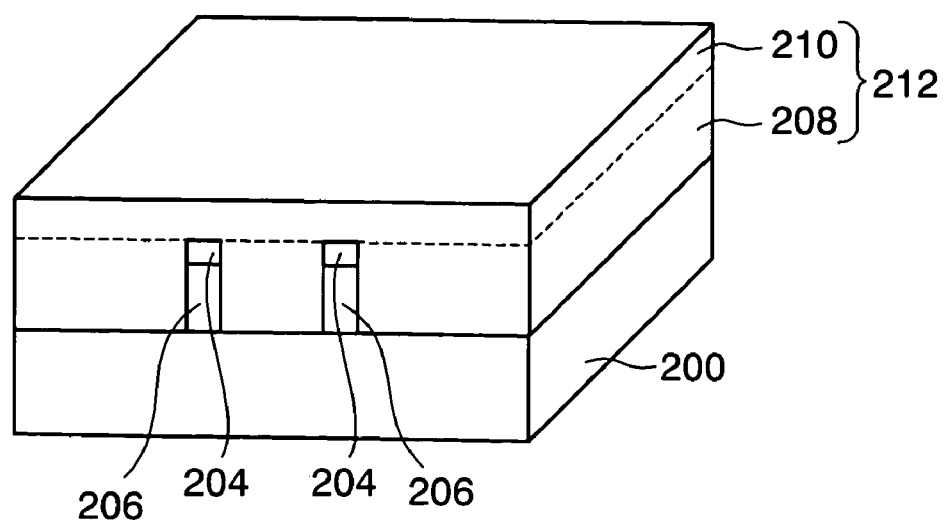
FIG. 13 is a sectional view for explaining the manufacturing process of the semiconductor device in the second embodiment.

Thereafter, as shown in FIG. 12, the gate polysilicon 208 is planarized by CMP (Chemical Mechanical Polishing) and etched back until the SiN hard mask 204 is exposed. Subsequently, as shown in FIG. 13, a second-layer gate polysilicon 210 is formed. In this embodiment, this gate polysilicon 210 is formed so as to have a film thickness of approximately 50 nm. Here, these gate polysilicon 208 and gate polysilicon 210 together are referred to as a gate polysilicon 212.

Figure 14:
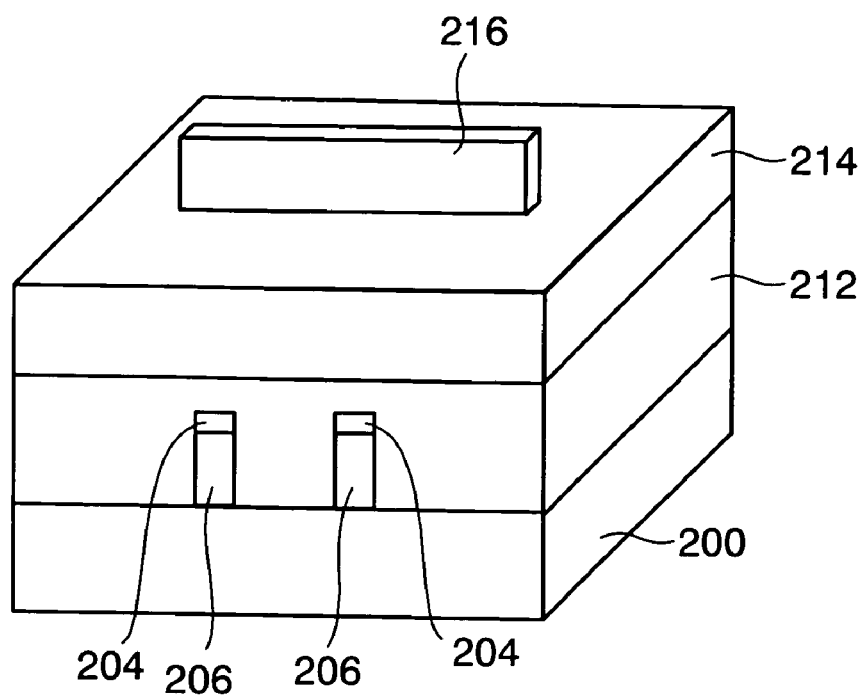
FIG. 14 is a sectional view for explaining the manufacturing process of the semiconductor device in the second embodiment.

Next, as shown in FIG. 14, a SiN hard mask 214 is formed on the gate polysilicon 212. In this embodiment, this SiN hard mask 214 is formed to have a thickness of approximately 100 nm. Subsequently, this SiN hard mask 214 is coated with a resist and patterned, and thereby a gate pattern 216 is formed.

Figure 15:
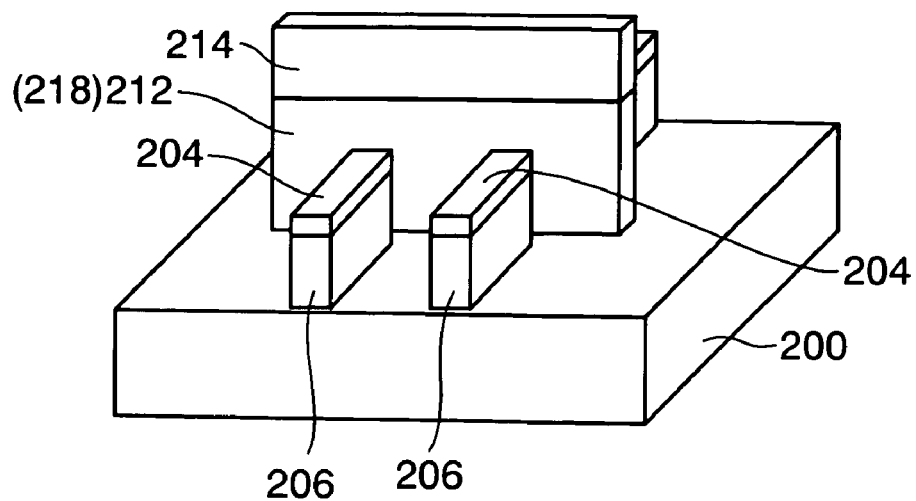
FIG. 15 is a sectional view for explaining the manufacturing process of the semiconductor device in the second embodiment.

Then, as shown in FIG. 15, after the SiN hard mask 214 is etched by RIE with the gate pattern 216 as a mask, the gate pattern 216 is removed. Subsequently, with this SiN hard mask 214 as a mask, the gate polysilicon 212 is etched. As a result, a gate electrode 218 is formed from the gate polysilicon 212.

Figure 16:
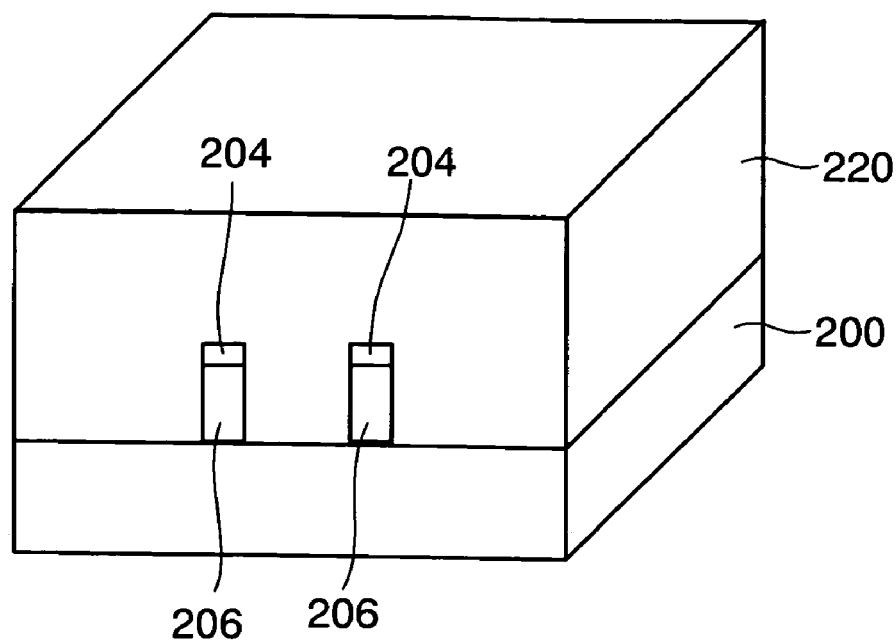
FIG. 16 is a sectional view for explaining the manufacturing process of the semiconductor device in the second embodiment.
Figure 17:
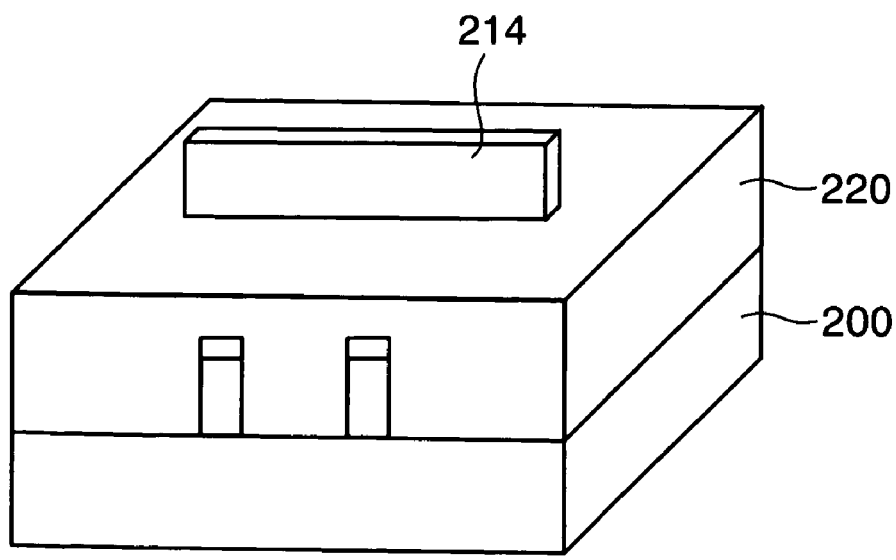
FIG. 17 is a sectional view for explaining the manufacturing process of the semiconductor device in the second embodiment.

Thereafter, as shown in FIG. 16, an insulating film 220 composed of a material (TEOS, for example) to form a sidewall on a sidewall portion of the gate electrode is formed overall higher than the height of the gate electrode 218 and planarized. Subsequently, as shown in FIG. 17, the insulating film 220 is etched back to expose the SiN hard mask 214 on the gate electrode 218.

Figure 18:
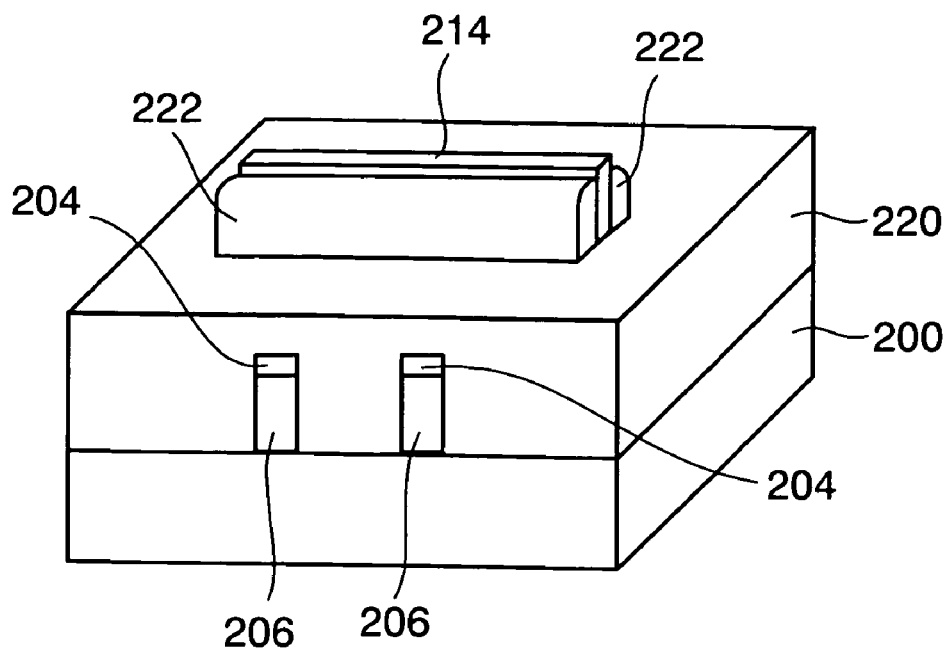
FIG. 18 is a sectional view for explaining the manufacturing process of the semiconductor device in the second embodiment.

Next, as shown in FIG. 18, an insulating film (SiN, for example) is formed and etched back, and thereby a first sidewall 222 is formed. Incidentally, in actuality, the first sidewall 222 is formed wholly around the SiN hard mask 214, but in FIG. 18 and the following figures, to facilitate understanding, the first sidewall 222 formed in a short side direction of the SiN hard mask 214 is omitted and not shown.

Figure 19:
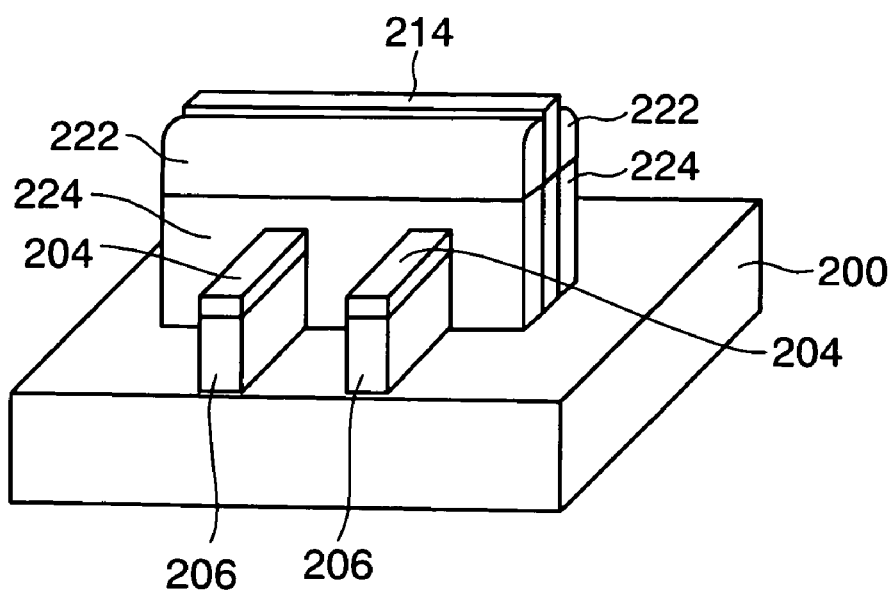
FIG. 19 is a sectional view for explaining the manufacturing process of the semiconductor device in the second embodiment.

Then, as shown in FIG. 19, by etching the insulating film 220 by RIE with the first sidewall 222 and the SiN hard mask 214 as a mask, a second sidewall 224 is formed from the insulating film 220 remaining on the sidewall portion of the gate electrode 218. For this purpose, it is desirable that the insulating film 220 should have a higher etching selective ratio than the first sidewall 222 and the SiN hard mask 214.

Figure 20:
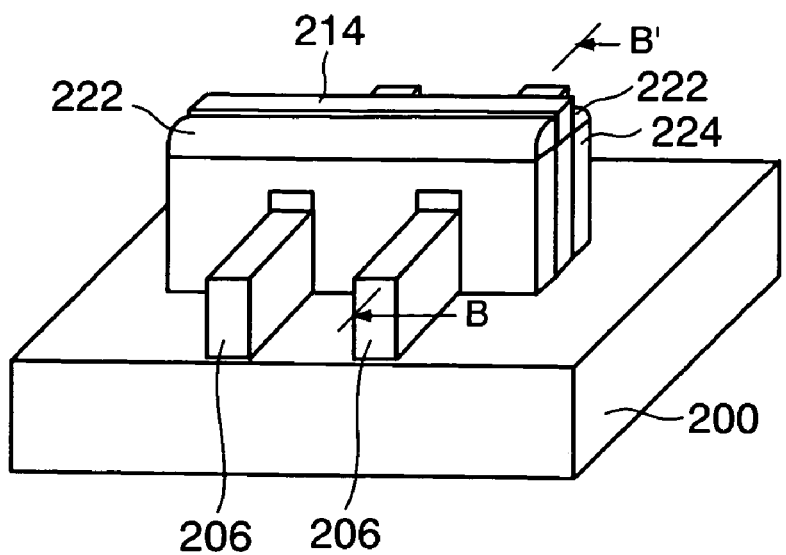
FIG. 20 is a sectional view for explaining the manufacturing process of the semiconductor device in the second embodiment.

Thereafter, as shown in FIG. 20, the SiN hard mask 204 on each of the Fins 206 is removed by etching by performing SiN-RIE. Subsequently, the side surface of the Fin 206 is doped to form source/drain regions, and silicidation is applied to the formed source/drain regions. The doping of the side surface of the Fin 206 can be performed by oblique ion implantation or can be performed by plasma doping or solid phase diffusion. Moreover, as a silicide material, for example, NiSi can be used.

Figure 21:
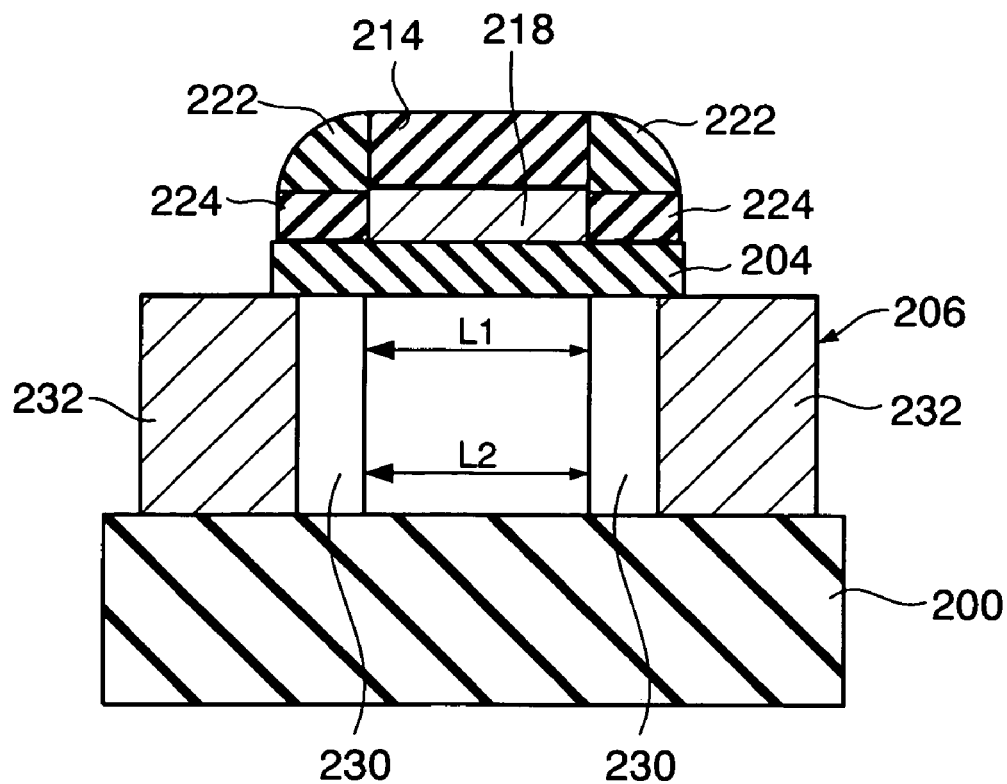
FIG. 21 is a sectional view taken along the line B-B' in FIG. 20.

FIG. 21 is a sectional view taken along the line B-B' in FIG. 20 after silicidation. As shown in FIG. 21, the first sidewall 222 and the second sidewall 224 are formed only on the sidewall portion of the gate electrode 218 and not formed on the sidewall portion of the Fin 206. Therefore, by doping the Fin 206 from the side surface thereof, it is possible to form a source diffusion layer region 230 on one side of the Fin 206 and a drain diffusion layer region 230 on the other side of the Fin 206 and form a silicide 232 to the side surface.

When the Fin 206 is doped from the side surface thereof, a distance L1 between the source region and the drain region in an upper portion of the Fin 206 and a distance L2 between the source region and the drain region in a lower portion of the Fin 206 become substantially equal, so that the source/drain regions 230 which are uniform in a depth direction of the Fin 206 can be formed. Namely, an effective channel length can be made uniform in the depth direction of the Fin 206. Further, sufficient doping and silicide formation can be performed as far as the lower portion of the Fin 206, so that a parasitic resistance R can be reduced, which leads to an improvement in transistor drive capability.

Third Embodiment

Figure 22:
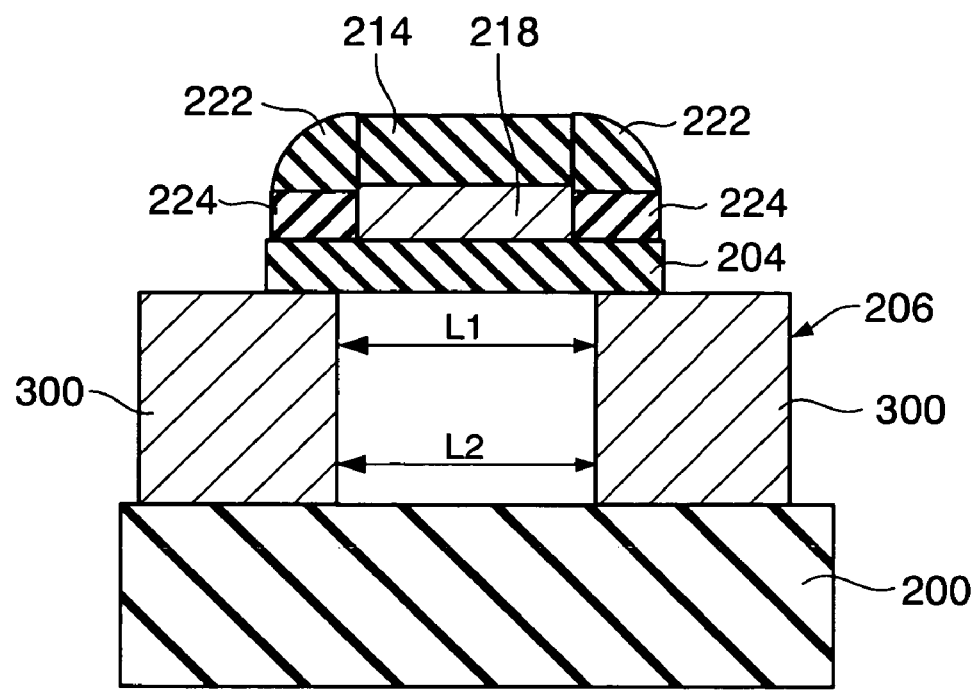
FIG. 22 is a sectional view of a semiconductor device according to a third embodiment.

FIG. 22 is a sectional view for explaining a semiconductor device according to the third embodiment and corresponds to FIG. 21 in the aforementioned second embodiment. Only portions different from those in the aforementioned second embodiment will be explained. As shown in FIG. 22, in this embodiment, in source/drain regions, only silicide 300 is formed without an impurity diffusion layer being formed. Namely, a FinFET having a Schottky junction source/drain structure is formed. A manufacturing process and a structure other than the above are the same as in the aforementioned second embodiment.

According to this embodiment, the first sidewall 222 and the second sidewall 224 are formed on a side surface portion of the gate electrode 218, but no sidewall is formed on a side surface portion of the Fin 206. Therefore, it becomes possible to form the silicide 300 to a sidewall surface of the Fin 206. Consequently, Schottky source/drain regions which are uniform in the depth direction of the Fin 206 can be formed. Namely, the distance L1 between the Schottky source region and the Schottky drain region in the upper portion of the Fin 206 and the distance L2 between the Schottky source region and the Schottky drain region in the lower portion of the Fin 206 can be made substantially equal. Namely, an effective channel length can be made uniform in the depth direction of the Fin 206.

Further, the low-resistance silicide 300 is formed in lower portions of the Schottky source/drain regions, so that the parasitic resistance R can be reduced, which leads to an improvement in transistor drive capability.

Incidentally, it is desirable to use a material with a low Schottky barrier as a material for the silicide 300 in order to reduce a Schottky contact resistance. For example, in the case of an n-type MOS transistor, it is suitable to use Er or the like whose work function is smaller than a median of a bandgap as the material for the silicide 300 and form the silicide 300 by ErSi. In the case of a p-type MOS, it is suitable to use Pt or the like whose work function is larger than the median of the bandgap as the material for the silicide 300 and form the silicide 300 by PtSi.

Fourth Embodiment

Figure 23:
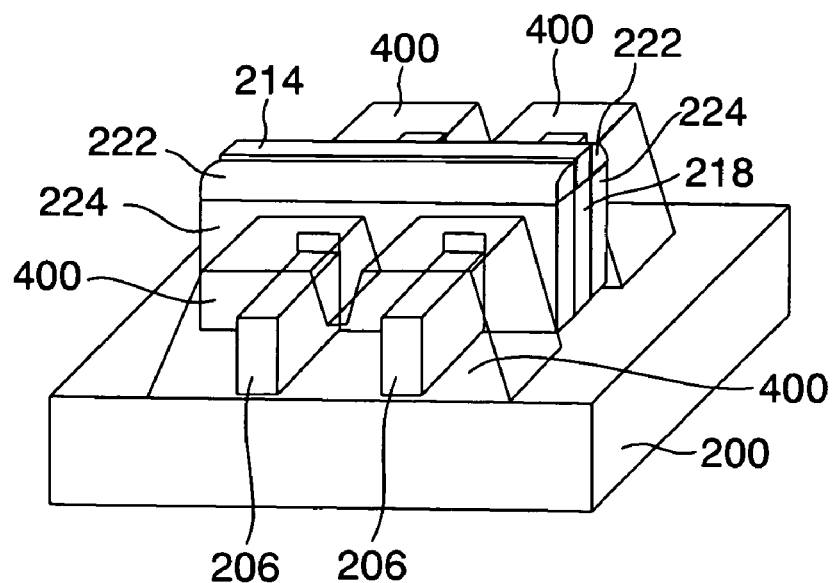
FIG. 23 is a sectional view of a semiconductor device according to a fourth embodiment.

FIG. 23 is a sectional view for explaining a semiconductor device according to the fourth embodiment. As shown in FIG. 23, also in this embodiment, as in the aforementioned second embodiment, the first sidewall 222 and the second sidewall 224 are formed on the side surface portion of the gate electrode 218, but no sidewall is formed on the side surface portion of the Fin 206.

However, in this embodiment, after an impurity diffusion layer is formed as the source/drain regions, source/drain portions are lifted, for example, by epitaxial growth. Namely, since an upper surface and a side surface of the Fin 206 is exposed, an eptixial silicon portion 400 can be formed on the upper surface and the side surface of the Fin 206 by epitaxial growth. It is also possible that after this epitaxial silicon portion 400 is formed, impurity ion implantation and silicide formation may be performed as required.

According to a manufacturing method of the semiconductor device of this embodiment, no sidewall is formed on the side surface portion of the Fin 206, so that the epitaxial silicon portion 400 can be formed by epitaxial growth. Moreover, by forming the epitaxial silicon portion 400, the parasitic resistance R of the source/drain regions can be reduced, which leads to an improvement in transistor drive capability.

Fifth Embodiment

Figure 24:
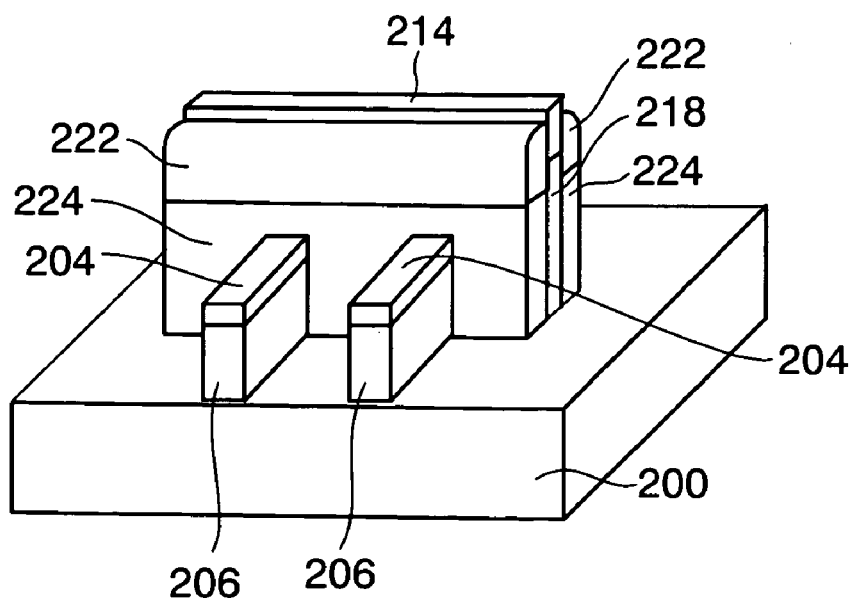
FIG. 24 is a sectional view for explaining a manufacturing process of a semiconductor device in a fifth embodiment.
Figure 25:
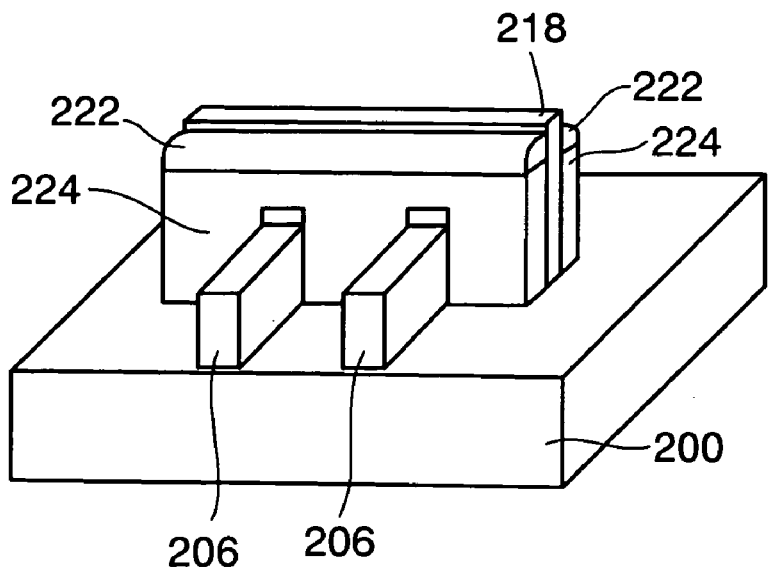
FIG. 25 is a sectional view for explaining the manufacturing process of the semiconductor device in the fifth embodiment.
Figure 26:
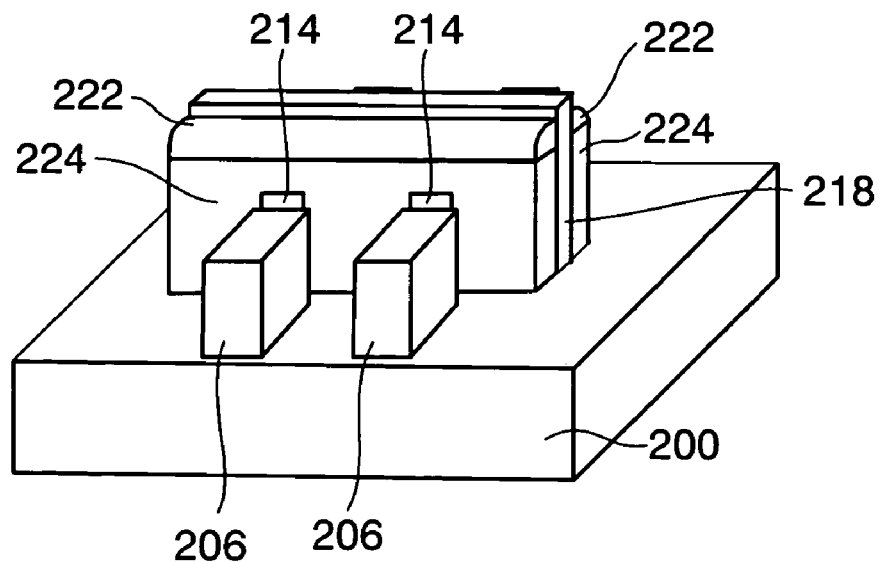
FIG. 26 is a sectional view for explaining the manufacturing process of the semiconductor device in the fifth embodiment.

FIG. 24 to FIG. 26 are sectional views for explaining a manufacturing process of a semiconductor device according to the fifth embodiment. The process up to FIG. 24 is the same manufacturing process as in the aforementioned second embodiment. Namely, the first sidewall 222 and the second sidewall 224 are formed on the side surface portion of the gate electrode 218, but no sidewall is formed on the side surface portion of the Fin 206.

Subsequently, as shown in FIG. 25, the SiN hard mask 204 on the Fin 206 and the SiN hard mask 214 on the gate electrode 218 are removed by SiN-RIE. Then, to form source/drain regions, an impurity diffusion layer is formed on both right and left sides of the Fin 206 by doping.

Thereafter, as shown in FIG. 26, the source/drain portions of the Fin 206 and the gate electrode 218 are all silicided to be tuned into a metal source/drain and a metal gate electrode, respectively. The gate electrode 218 is formed extremely thin, and the buried insulating film 200 is thereunder. Since the buried insulating film 200 is originally not silicided, the gate electrode 218 can be silicided to its lower end in this embodiment.

According to this embodiment, the first sidewall 222 and the second side wall 224 are formed on the side surface portion of the gate electrode 218, but no sidewall is formed on the sidewall portion of the Fin 206, whereby silicide can be formed on the side surface of the Fin 206. Therefore, the parasitic resistance R in the source/drain regions is reduced, which leads to an improvement in transistor drive capability. Moreover, polysilicon composing the gate electrode 218 can be all silicided to form a metal gate, whereby the threshold voltage of a fully depleted transistor (FinFET) can be controlled, resulting in the realization of high drive current at a low voltage.

Figure 27:
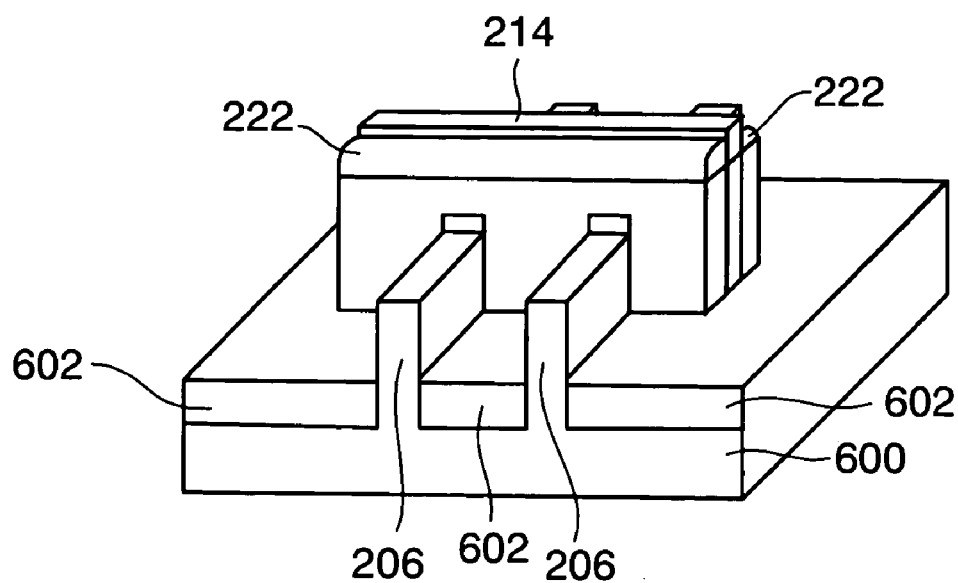
FIG. 27 is a sectional view of a semiconductor device for explaining another modification.

It should be mentioned that the present invention is not limited to the aforementioned embodiments, and various changes may be made therein. For example, as shown in FIG. 27, the FinFET may be formed on a silicon substrate 600 by the manufacturing process in each of the aforementioned embodiments. In this case, it is suitable to form Fins 206 by etching the silicon substrate 600 and form an STI (Shallow Trench Isolation) from a silicon oxide film 602 or the like between the Fins 206.

Further, the aforementioned embodiments are explained with the FinFET as an example of a semiconductor device to which the present invention is applied, but the present invention is also applicable to other kinds of semiconductor devices.

Sixth Embodiment

If a sidewall pattern transfer process is used for the formation of a Fin (convex silicon region, active area) and a gate electrode, a pattern which is finer than the limit of photolithography and whose line edge roughness (LER) is small can be formed. A step-by-step explanation of a manufacturing process will be given below.

Figure 28:
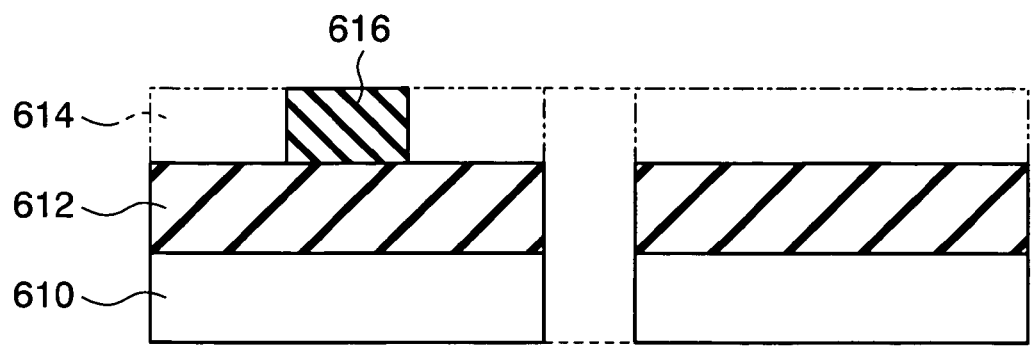
FIG. 28 is a sectional view for explaining a manufacturing process of a semiconductor device in a sixth embodiment.

First, as shown in FIG. 28, a silicon nitride film 612 is formed on a semiconductor substrate 610 with a thin oxide film not shown therebetween, In this embodiment, the thickness of this silicon nitride film 612 is, for example, 100 nm. Subsequently, an amorphous silicon layer 614, for example, with a thickness of approximately 150 nm is formed on the silicon nitride film 612. Thereafter, a resist pattern, for example, with a width of approximately 0.1 μm is formed on the amorphous silicon layer 614 by photolithography, and the amorphous silicon layer 614 is etched by RIE with this resist pattern as a mask. Thus, a dummy pattern 616 is obtained.

Figure 29:
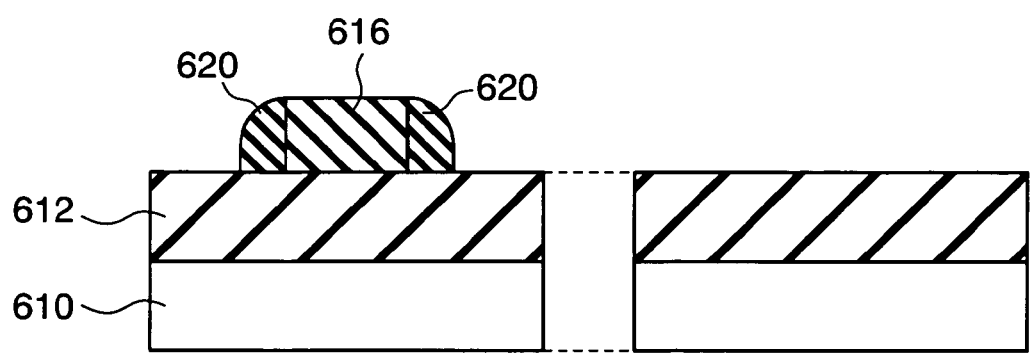
FIG. 29 is a sectional view for explaining the manufacturing process of the semiconductor device in the sixth embodiment.

Then, as shown in FIG. 29, after TEOS, for example, with a thickness of approximately 40 nm is formed thereon, the entire surface is etched back by RIE, and thereby a sidewall 620 is formed on a side surface portion of the dummy pattern 616.

Figure 30:
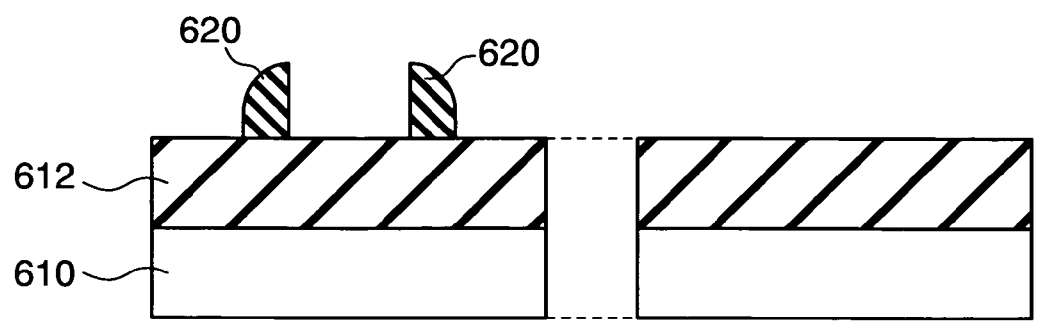
FIG. 30 is a sectional view for explaining the manufacturing process of the semiconductor device in the sixth embodiment.

Thereafter, as shown in FIG. 30, the dummy pattern 616 formed from amorphous silicon is removed by etching to leave the sidewall 620 formed from the TEOS on the silicon nitride film 612.

Figure 31:
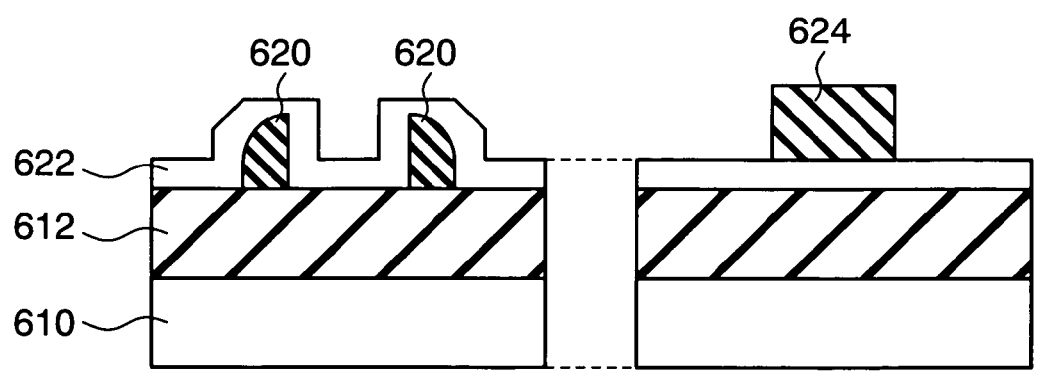
FIG. 31 is a sectional view for explaining the manufacturing process of the semiconductor device in the sixth embodiment.

Subsequently, as shown in FIG. 31, an anti-reflective coating (ARC) 622 to prevent the reflection of light is formed thereon. Then, a photoresist is formed on the anti-reflective coating 622, and by patterning this photoresist by photolithography, a resist pattern 624 is formed. In this embodiment, the width of this resist pattern 624 is formed wider than the width of the sidewall 620. Incidentally, as disclosed in the aforementioned Document 1, the resist pattern 624 and the sidewall 620 may overlap with each other.

Figure 32:
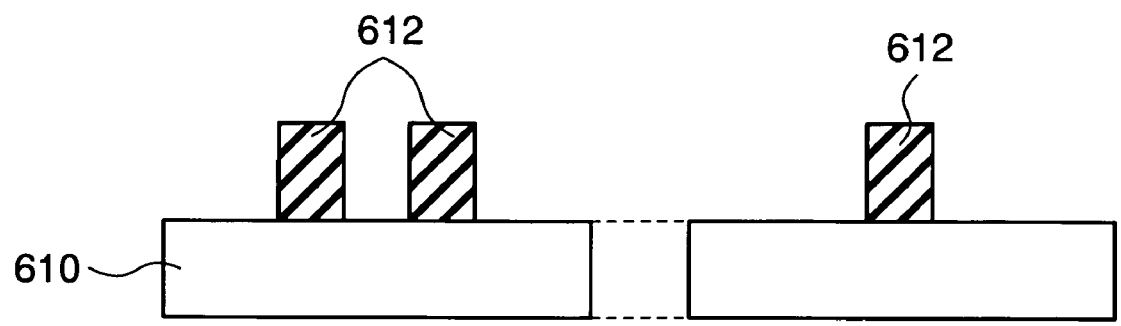
FIG. 32 is a sectional view for explaining the manufacturing process of the semiconductor device in the sixth embodiment.

Then, as shown in FIG. 32, the silicon nitride film 612 is etched by RIE with the resist pattern 624 and the sidewall 620 as a mask. Subsequently, the sidewall 620 and the resist pattern 624 are removed by wet etching or the like.

Figure 33:
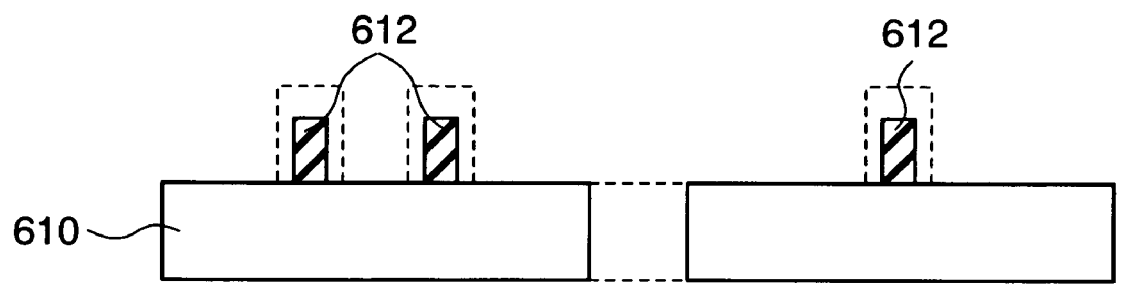
FIG. 33 is a sectional view for explaining the manufacturing process of the semiconductor device in the sixth embodiment.
Figure 34:
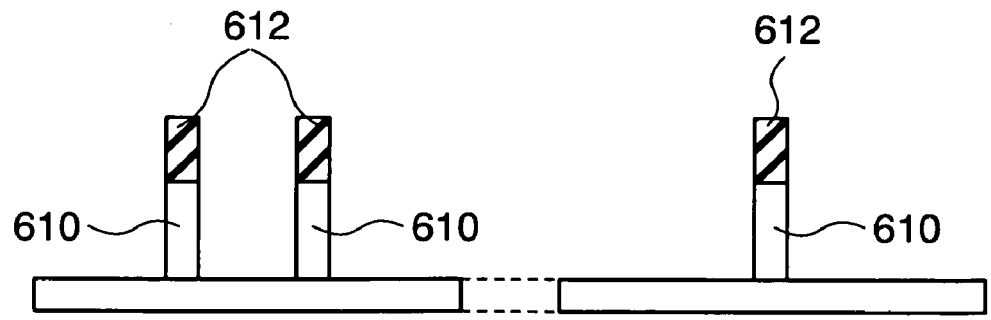
FIG. 34 is a sectional view for explaining the manufacturing process of the semiconductor device in the sixth embodiment.

Next, as shown in FIG. 33, the silicon nitride film 612 is thinned by wet etching with hot phosphoric acid or the like. Then, as shown in FIG. 34, the semiconductor substrate 610 is patterned by RIE.

In so doing, a pattern which is finer than the limit of photolithography and whose line edge roughness (LER) is small can be formed by pattern transfer of the sidewall 620. The reason why the LER is reduced is that the line width of the pattern of the sidewall 620 is determined by the thickness of the formed TEOS.

However, as can be seen from FIG. 31 to FIG. 32, if the resist pattern 624 is formed using the anti-reflective coating 622, there arises a problem that the anti-reflective coating 622 remains on the side surface of the sidewall 620, and thereby the line pattern of the sidewall 620 formed expressly thin becomes thick. On the other hand, if light reflects diffusely in photolithography, the shape of the resist pattern 624 is deformed, which hinders scaling down. Therefore, it is difficult to omit the anti-reflective coating 622 in order to scale down the resist pattern 624.

Seventh Embodiment

Hence, in the seventh embodiment, it is prevented that the line pattern of the sidewall 620 is thickened by the anti-reflective coating 622.

Figure 35:
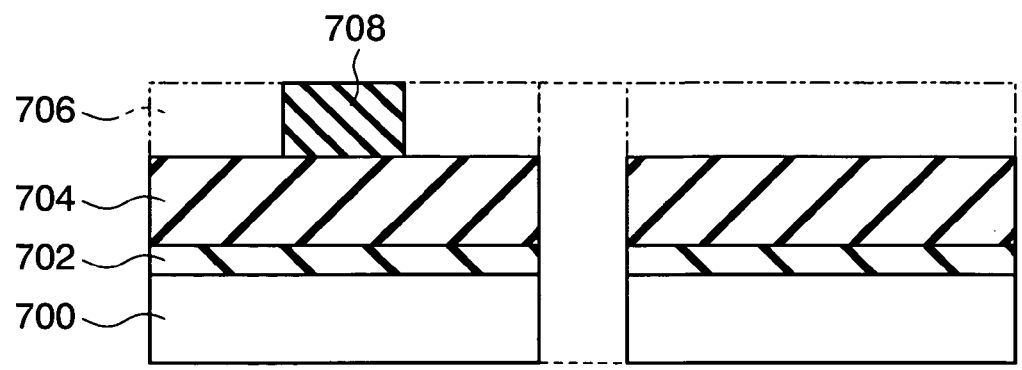
FIG. 35 is a sectional view for explaining a manufacturing process of a semiconductor device in a seventh embodiment.

First, as shown in FIG. 35, in this embodiment, an insulating film 702 is formed on a semiconductor substrate 700 composed of silicon. This insulating film is composed of, for example, a silicon oxide film ($SiO_2$).

Then, a silicon nitride film 704 is formed on the insulating film 702. In this embodiment, the thickness of this silicon nitride film 704 is, for example, 100 nm. Incidentally, the insulating film 702 of the silicon oxide film is formed between the semiconductor substrate 700 and the silicon nitride film 704 in order to relieve stress by the mediation of the insulating film 702 of the silicon oxide film. This silicon nitride film 704 corresponds to a second film in this embodiment.

Subsequently, an amorphous silicon layer 706, for example, with a thickness of approximately 150 nm is formed on the silicon nitride film 704. Thereafter, a resist pattern with a width of approximately 0.1 μm is formed on the amorphous silicon layer 706 by photolithography, and the amorphous silicon layer 706 is etched by RIE with this resist pattern as a mask. Consequently, a dummy pattern 708 is obtained.

Figure 36:
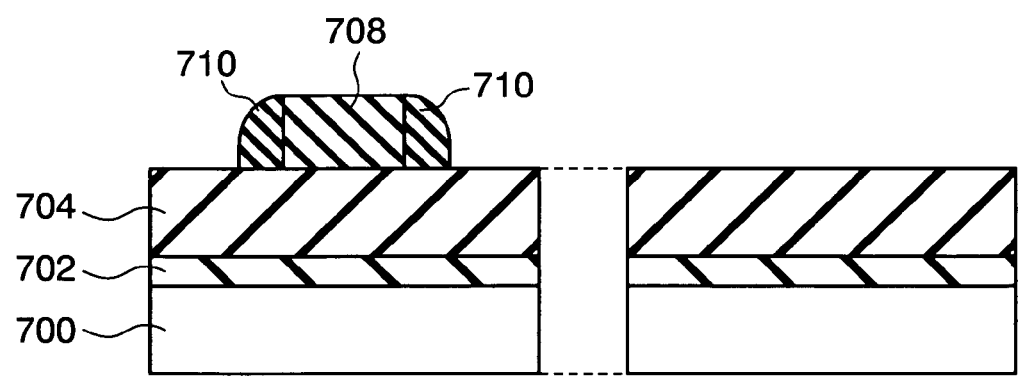
FIG. 36 is a sectional view for explaining the manufacturing process of the semiconductor device in the seventh embodiment.

Next, as shown in FIG. 36, after TEOS, for example, with a thickness of approximately 40 nm is formed thereon, the entire surface is etched back by RIE, and thereby a sidewall 710 is formed on a side surface portion of the dummy pattern 708.

Figure 37:
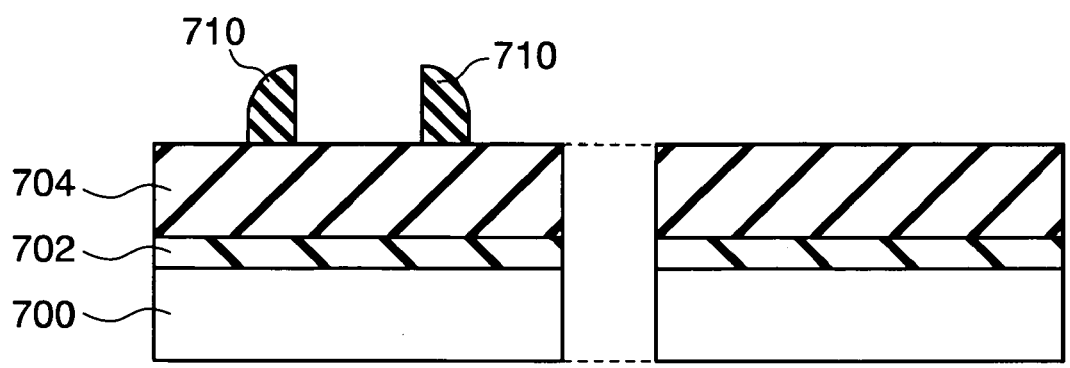
FIG. 37 is a sectional view for explaining the manufacturing process of the semiconductor device in the seventh embodiment.

Then, as shown in FIG. 37, the dummy pattern 708 formed from amorphous silicon is removed by etching to leave the sidewall 710 formed from TEOS on the silicon nitride film 704. This sidewall 710 corresponds to a first protrusion in this embodiment.

Figure 38:
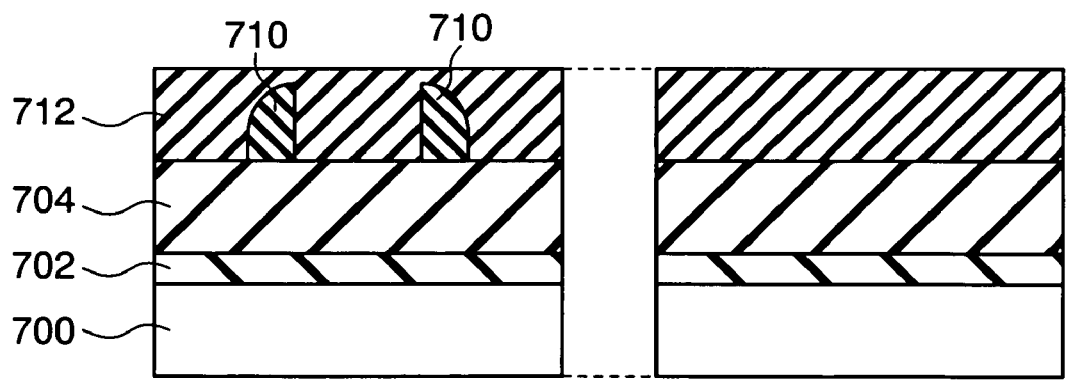
FIG. 38 is a sectional view for explaining the manufacturing process of the semiconductor device in the seventh embodiment.

Thereafter, as shown in FIG. 38, a material (for example, amorphous silicon) different from that for the sidewall 710 formed from TEOS is deposited and planarized by CMP (Chemical Mechanical Polishing) to form a base film 712. This base film corresponds to a first film.

Figure 39:
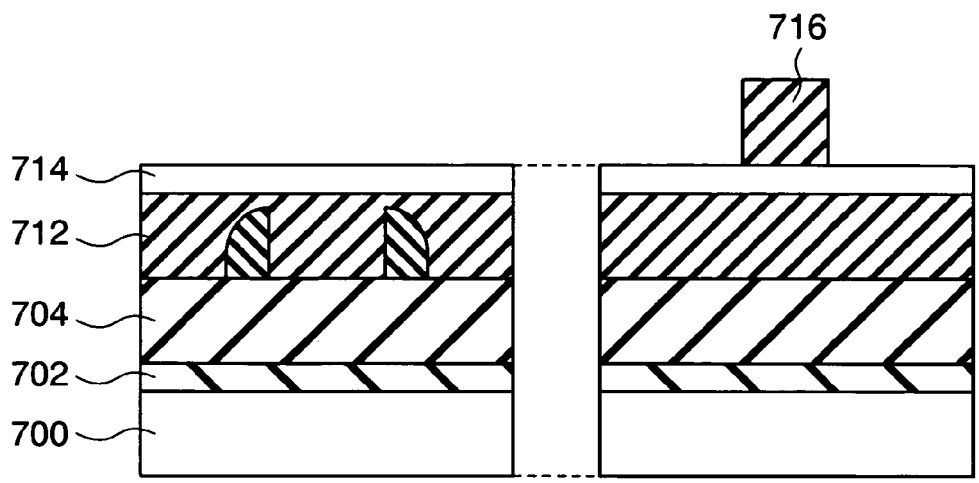
FIG. 39 is a sectional view for explaining the manufacturing process of the semiconductor device in the seventh embodiment.

Subsequently, as shown in FIG. 39, an anti-reflective coating (ARC) 714 to prevent the reflection of light is formed on the base film 712. Then, a photoresist is formed on the anti-reflective coating 714, and by patterning this photoresist by photolithography, a resist pattern 716 is formed. In this embodiment, the width of this resist pattern 716 is formed wider than the width of the sidewall 710. This resist pattern 716 corresponds to a mask portion in this embodiment.

Figure 40:
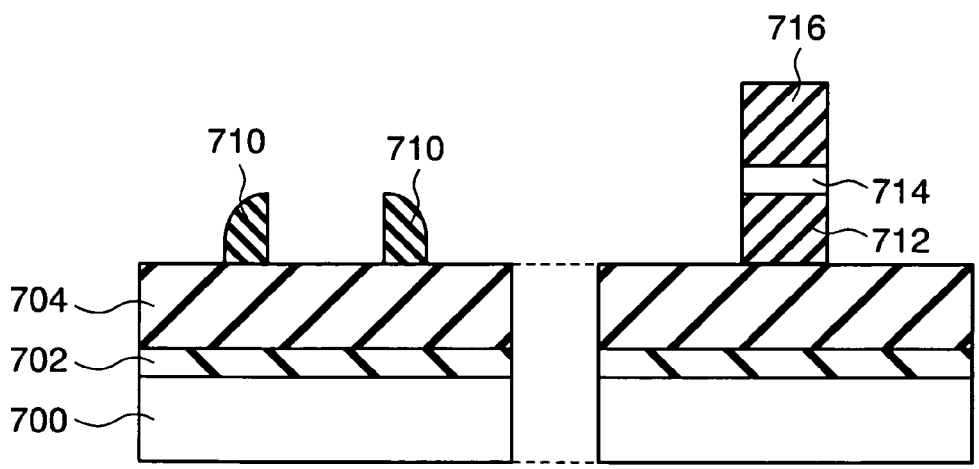
FIG. 40 is a sectional view for explaining the manufacturing process of the semiconductor device in the seventh embodiment.

Thereafter, as shown in FIG. 40, the base film 712 is etched by RIE with the resist pattern 716 as a mask. At this time, the sidewall 710 formed earlier is exposed. Then, the resist pattern 716 is removed.

Figure 41:
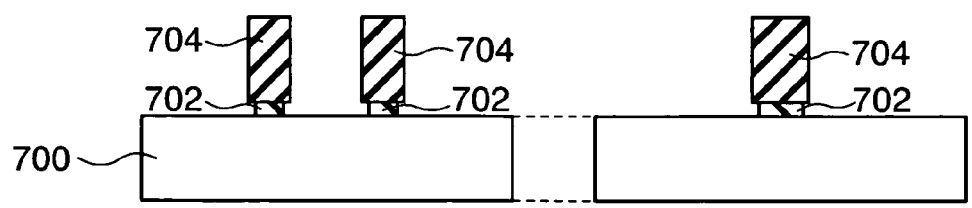
FIG. 41 is a sectional view for explaining the manufacturing process of the semiconductor device in the seventh embodiment.

Then, as shown in FIG. 41, the silicon nitride film 704 is etched by RIE with both the sidewall 710 and the base film 712 as a mask. Subsequently, the sidewall 710 and the base film 712 are removed by wet etching or the like. When the sidewall 710 of TEOS is removed by wet etching with HF or the like, the insulating film 702 is also etched.

Figure 42:
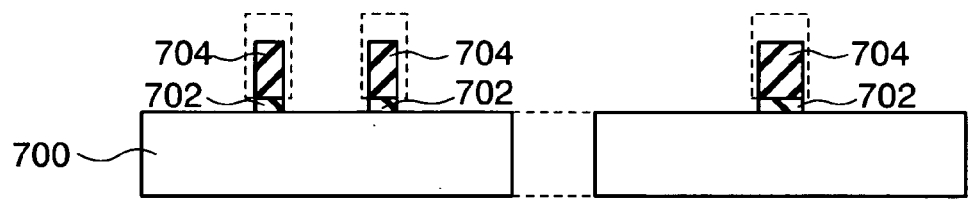
FIG. 42 is a sectional view for explaining the manufacturing process of the semiconductor device in the seventh embodiment.
Figure 43:
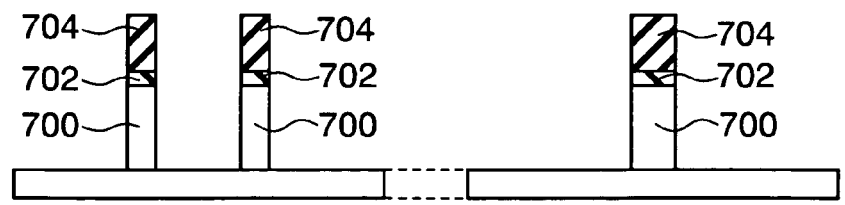
FIG. 43 is a sectional view for explaining the manufacturing process of the semiconductor device in the seventh embodiment.

Next, as shown in FIG. 42, the silicon nitride film 704 is thinned by wet etching with hot phosphoric acid or the like. Then, as shown in FIG. 43, the semiconductor substrate 700 is fabricated by RIE.

As described above, according to this embodiment, by pattern transfer of the sidewall 710 formed from TEOS, microfabrication which is finer than the limit of photolithography can be performed and a silicon pattern whose line edge roughness (LER) is small can be formed.

Moreover, even where the resist pattern 716 by photolithography is formed using the anti-reflective coating 714, the anti-reflective coating 714 does not remain on the side surface of the sidewall 710, which can prevent the pattern width of the sidewall 710 from widening.

Eighth Embodiment

This embodiment is different from the aforementioned seventh embodiment in that after the sidewall 710 is formed, without the dummy pattern 708 of amorphous silicon being removed, the second amorphous silicon is overlappingly formed. A step-by-step explanation of a manufacturing process will be given below.

Figure 44:
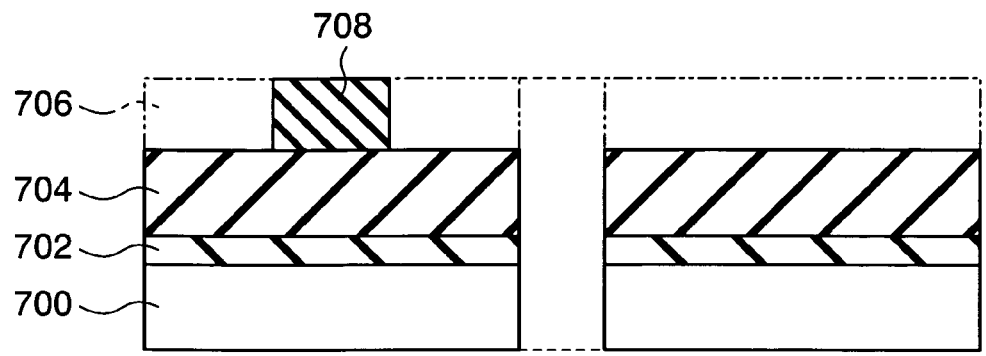
FIG. 44 is a sectional view for explaining a manufacturing process of a semiconductor device in an eighth embodiment.

As shown in FIG. 44, in this embodiment, the insulating film 702 is formed on the semiconductor substrate 700 composed of silicon. This insulating film is composed of, for example, a silicon oxide film ($SiO_2$).

Then, the silicon nitride film 704 is formed on the insulating film 702. In this embodiment, the thickness of this silicon nitride film 704 is, for example, 100 nm. Subsequently, the amorphous silicon layer 706, for example, with a thickness of approximately 150 nm is formed on the silicon nitride film 704. Thereafter, a resist pattern with a width of approximately 0.1 μm is formed on the amorphous silicon layer 706 by photolithography, and the amorphous silicon layer 706 is etched by RIE with this resist pattern as a mask. Consequently, the dummy pattern 708 is obtained.

Figure 45:
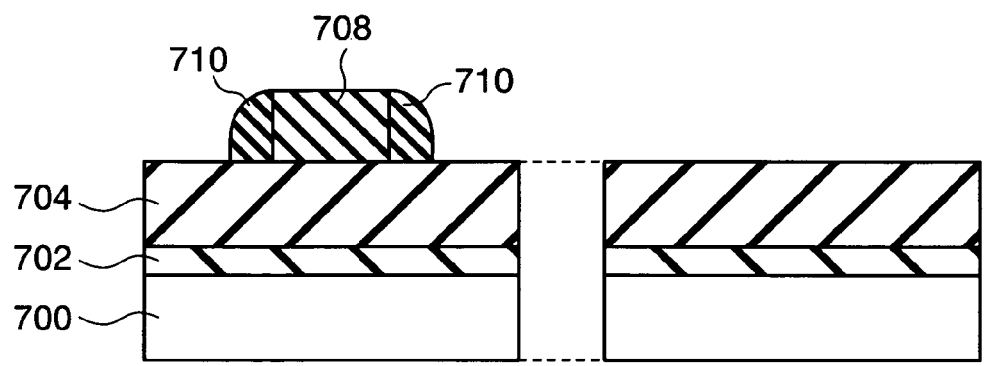
FIG. 45 is a sectional view for explaining the manufacturing process of the semiconductor device in the eighth embodiment.

Next, as shown in FIG. 45, after TEOS, for example, with a thickness of approximately 40 nm is formed thereon, the entire surface is etched back by RIE, and thereby the sidewall 710 is formed on the side surface portion of the dummy pattern 708.

Figure 46:
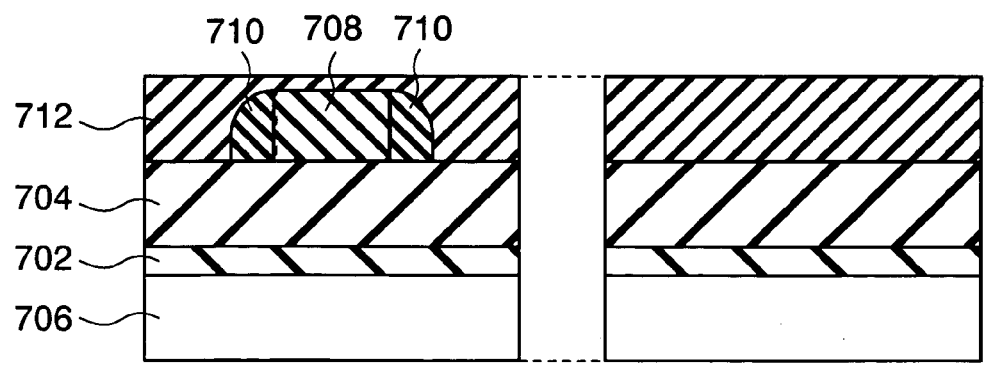
FIG. 46 is a sectional view for explaining the manufacturing process of the semiconductor device in the eighth embodiment.

Then, as shown in FIG. 46, a material (for example, amorphous silicon) different from that for the sidewall 710 formed from TEOS is deposited on these sidewall 710 and dummy pattern 708 and planarized by CMP to form the base film 712.

Figure 47:
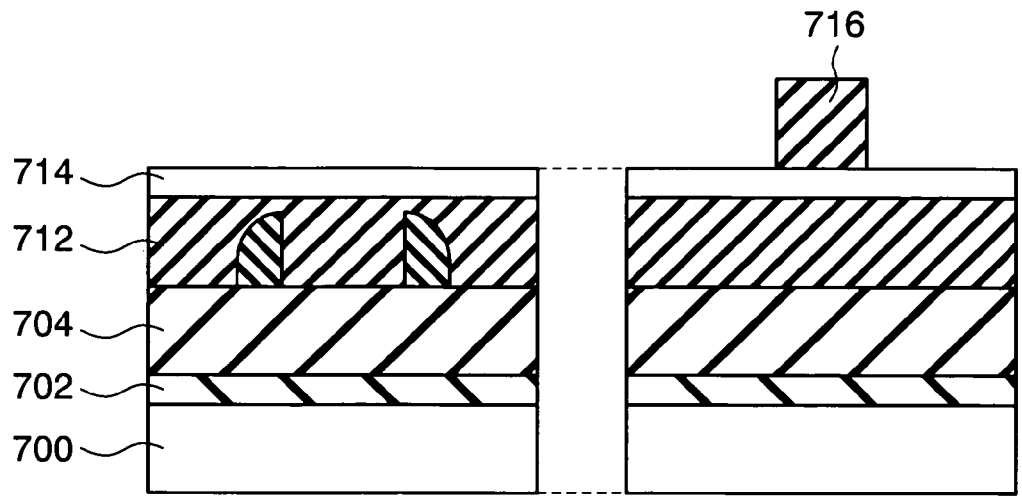
FIG. 47 is a sectional view for explaining the manufacturing process of the semiconductor device in the eighth embodiment.

Subsequently, as shown in FIG. 47, the anti-reflective coating (ARC) 714 to prevent the reflection of light is formed on the base film 712. Then, a photoresist is formed on the anti-reflective coating 714, and by patterning this photoresist by photolithography, the resist pattern 716 is formed. In this embodiment, the width of this resist pattern 716 is formed wider than the width of the sidewall 710.

Figure 48:
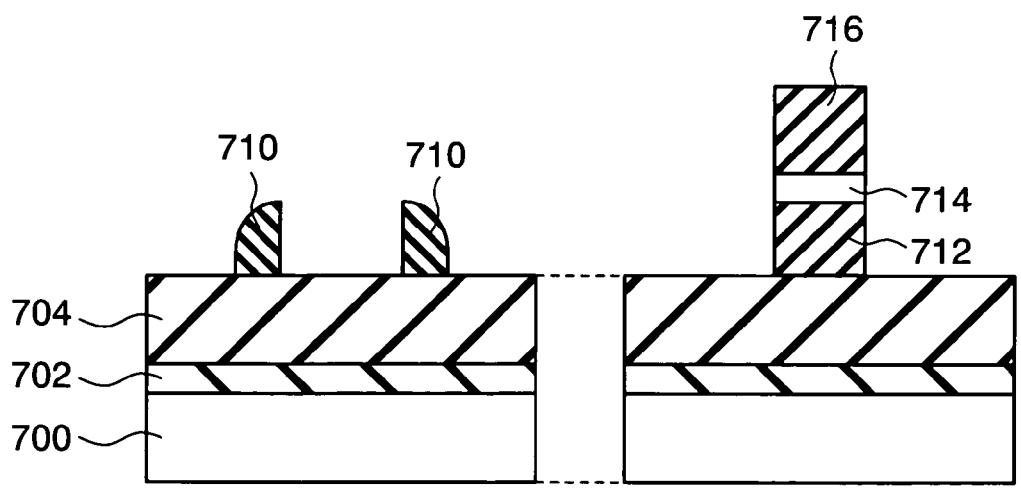
FIG. 48 is a sectional view for explaining the manufacturing process of the semiconductor device in the eighth embodiment.

Thereafter, as shown in FIG. 48, the base film 712 is etched by RIE with the resist pattern 716 as a mask. By this etching, the dummy pattern 708 is removed together and thereby the sidewall 710 formed earlier is exposed. The subsequent manufacturing process is the same as in the aforementioned seventh embodiment, and hence an explanation thereof is omitted.

As described above, also in this embodiment, by the pattern transfer of the sidewall 710 formed from TEOS, microfabrication which is finer than the limit of photolithography can be performed and a silicon pattern whose line edge roughness (LER) is small can be formed.

Moreover, the dummy pattern 708 located between the sidewalls 710 is removed together with the base film 712 by only one RIE, whereby the number of steps in the manufacturing process can be reduced, which leads to a reduction in cost.

Ninth Embodiment

This embodiment is different from the aforementioned eighth embodiment in that a stopper portion for polishing is formed on the surface of the dummy pattern 708 of amorphous silicon. A step-by-step explanation of a manufacturing process will be given below.

Figure 49:
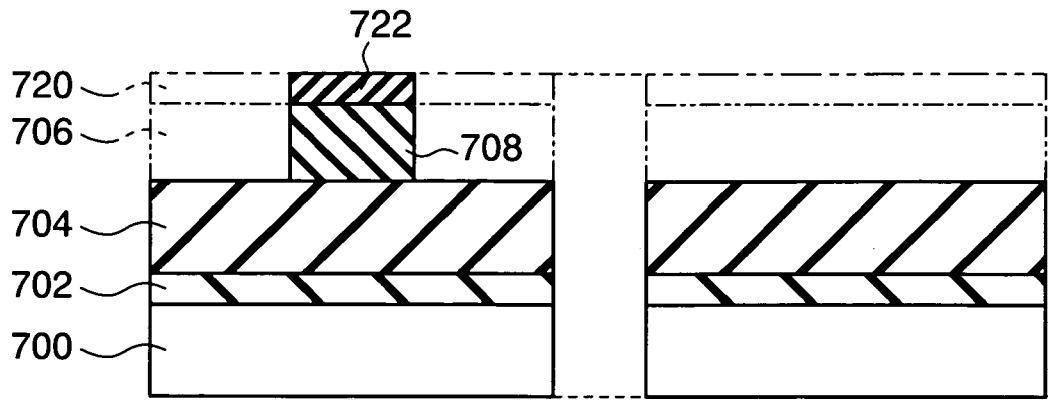
FIG. 49 is a sectional view for explaining a manufacturing process of a semiconductor device in a ninth embodiment.

As shown in FIG. 49, in this embodiment, the insulating film 702 is formed on the semiconductor substrate 700 composed of silicon. This insulating film is composed of, for example, a silicon oxide film ($SiO_2$).

Then, the silicon nitride film 704 is formed on the insulating film 702. In this embodiment, the thickness of this silicon nitride film 704 is, for example, 100 nm. Subsequently, the amorphous silicon layer 706, for example, with a thickness of approximately 150 nm is formed on the silicon nitride film 704. Thereafter, a silicon nitride film 720 is formed on the amorphous silicon layer 706. In this embodiment, this silicon nitride film 720 is formed so as to have, for example, a thickness of approximately 50 nm.

Subsequently, a resist pattern with a width of approximately 0.1 µm is formed on the silicon nitride film 720 by photolithography, and the silicon nitride film 720 and the amorphous silicon layer 706 are etched by RIE with this resist pattern as a mask. Consequently, a stopper portion 722 is obtained from the silicon nitride film 720, and the dummy pattern 708 is obtained from the amorphous silicon layer 706.

Figure 50:
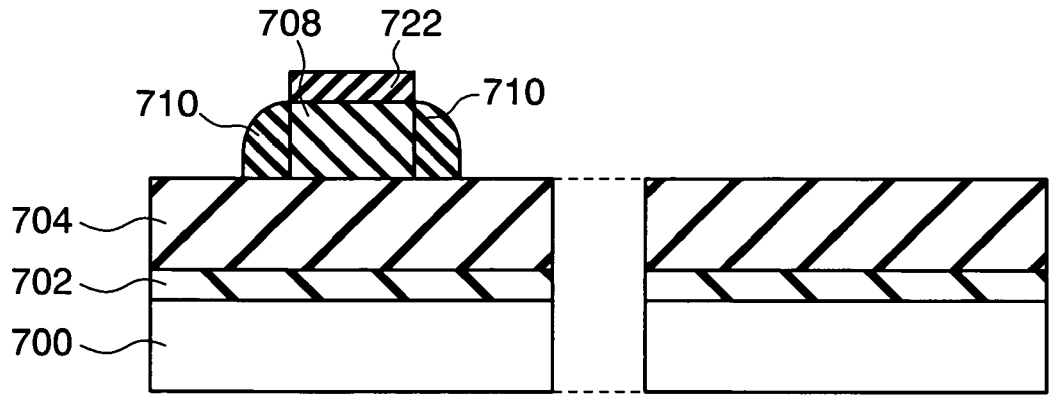
FIG. 50 is a sectional view for explaining the manufacturing process of the semiconductor device in the ninth embodiment.

Next, as shown in FIG. 50, after TEOS, for example, with a thickness of approximately 40 nm is formed thereon, the entire surface is etched back by RIE, and thereby the sidewall 710 is formed on the side surface portion of the dummy pattern 708.

Figure 51:
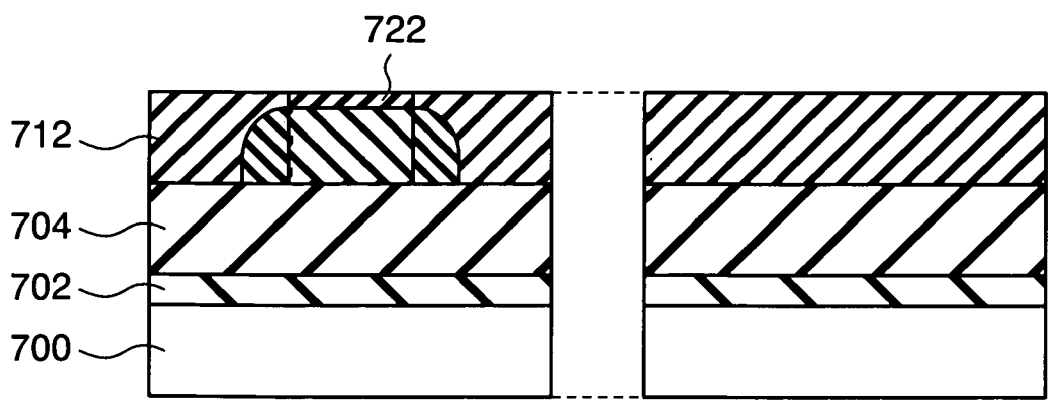
FIG. 51 is a sectional view for explaining the manufacturing process of the semiconductor device in the ninth embodiment.

Then, as shown in FIG. 51, a material (for example, amorphous silicon) different from that for the sidewall 710 formed from TEOS is deposited on these sidewall 710 and dummy pattern 708 and planarized by CMP to form the base film 712. The stopper portion 722 functions as a stopper when this CMP is performed. Note that it is desirable to adjust the process in such a manner that the thickness of the silicon nitride film 720 which has been thinned by CMP is approximately 20 nm or less.

Figure 52:
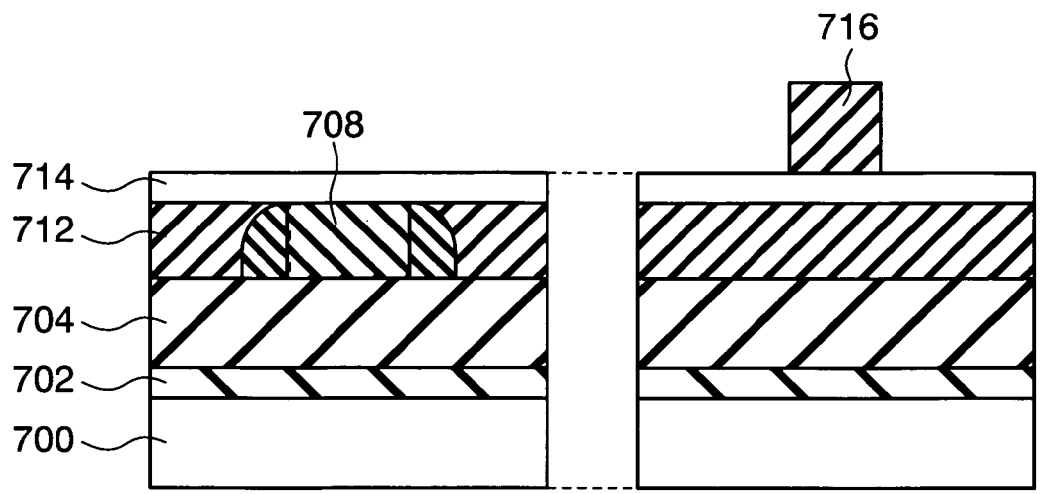
FIG. 52 is a sectional view for explaining the manufacturing process of the semiconductor device in the ninth embodiment.

Subsequently, as shown in FIG. 52, the stopper portion 722 which has been thinned by CMP is removed, and the anti-reflective coating (ARC) 714 to prevent the reflection of light is formed on the base film 712. Then, a photoresist is formed on the anti-reflective coating 714, and by patterning this photoresist by photolithography, the resist pattern 716 is formed. In this embodiment, the width of this resist pattern 716 is formed wider than the width of the sidewall 710.

Figure 53:
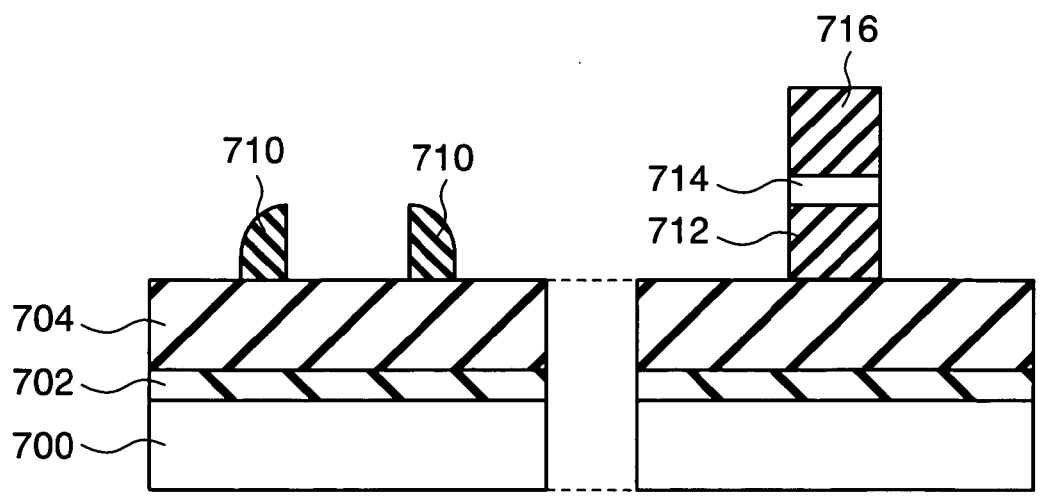
FIG. 53 is a sectional view for explaining the manufacturing process of the semiconductor device in the ninth embodiment.

Thereafter, as shown in FIG. 53, the base film 712 is etched by RIE with the resist pattern 716 as a mask. By this etching, the dummy pattern 708 is removed together and thereby the sidewall 710 formed earlier is exposed. The subsequent manufacturing process is the same as in the aforementioned seventh embodiment, and hence an explanation thereof is omitted.

As described above, also in this embodiment, by the pattern transfer of the sidewall 710 formed from TEOS, microfabrication which is finer than the limit of photolithography can be performed and a silicon pattern whose line edge roughness (LER) is small can be formed.

Moreover, when the base film 712 is planarized by polishing (CMP in this embodiment), the stopper portion 722 functions as a stopper, whereby polishing can be performed more easily.

Tenth Embodiment

In this embodiment, a material for forming the hard mask 704 to fabricate silicon and a material for forming the sidewall 710 in the aforementioned seventh embodiment are interchanged. A step-by-step explanation of a manufacturing process will be given below.

Figure 54:
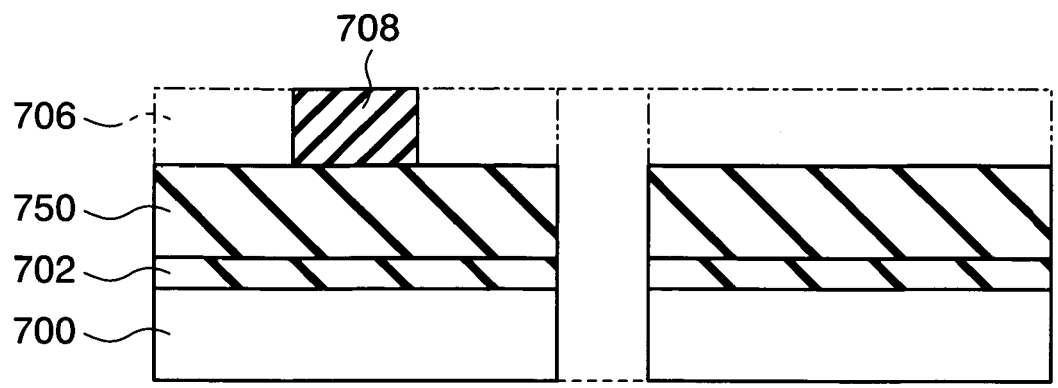
FIG. 54 is a sectional view for explaining a manufacturing process of a semiconductor device in a tenth embodiment.

As shown in FIG. 54, in this embodiment, the insulating film 702 is formed on the semiconductor substrate 700 composed of silicon. This insulating film is composed of, for example, a silicon oxide film ($SiO_2$).

Then, a TEOS film 750 is formed on the insulating film 702. In this embodiment, the thickness of this TEOS film 750 is, for example, 100 nm. Subsequently, the amorphous silicon layer 706, for example, with a thickness of approximately 150 nm is formed on the TEOS film 750. Thereafter, a resist pattern with a width of approximately 0.1 µm is formed on the amorphous silicon layer 706 by photolithography, and the amorphous silicon layer 706 is etched by RIE with this resist pattern as a mask. Consequently, the dummy pattern 708 is obtained.

Figure 55:
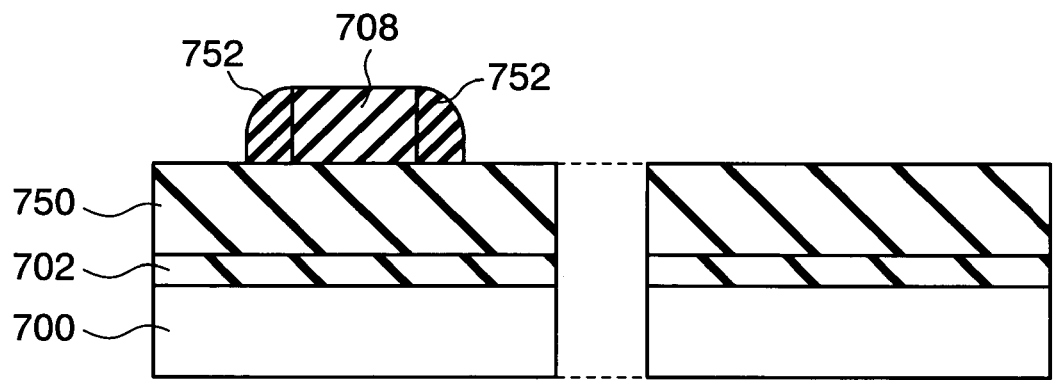
FIG. 55 is a sectional view for explaining the manufacturing process of the semiconductor device in the tenth embodiment.

Next, as shown in FIG. 55, after a silicon nitride film, for example, with a thickness of approximately 40 nm is formed thereon, the entire surface is etched back by RIE, and thereby a sidewall 752 is formed on the side surface portion of the dummy pattern 708.

Figure 56:
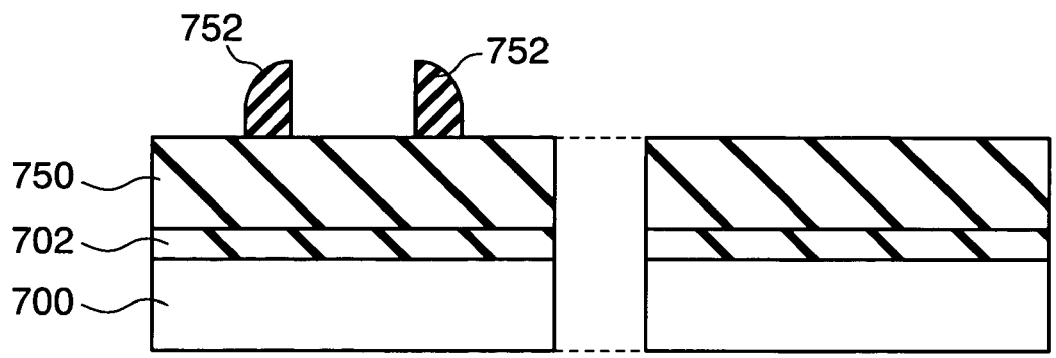
FIG. 56 is a sectional view for explaining the manufacturing process of the semiconductor device in the tenth embodiment.

Then, as shown in FIG. 56, the dummy pattern 708 formed from amorphous silicon is removed by etching to leave the sidewall 752 formed from nitride silicon on the TEOS film 750.

Figure 57:
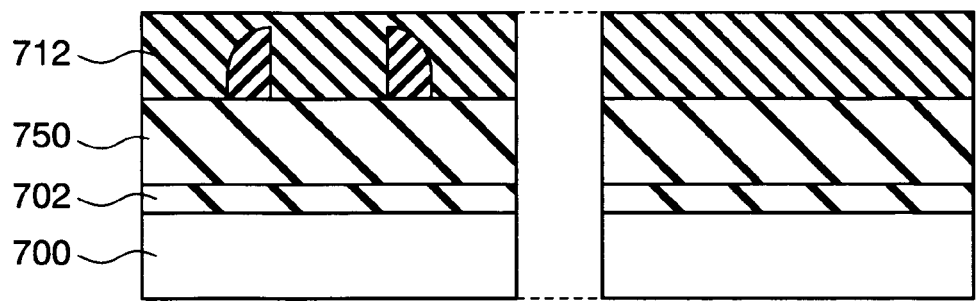
FIG. 57 is a sectional view for explaining the manufacturing process of the semiconductor device in the tenth embodiment.

Thereafter, as shown in FIG. 57, a material (for example, amorphous silicon) different from that for the sidewall 752 formed from nitride silicon is deposited and planarized by CMP to form the base film 712.

Figure 58:
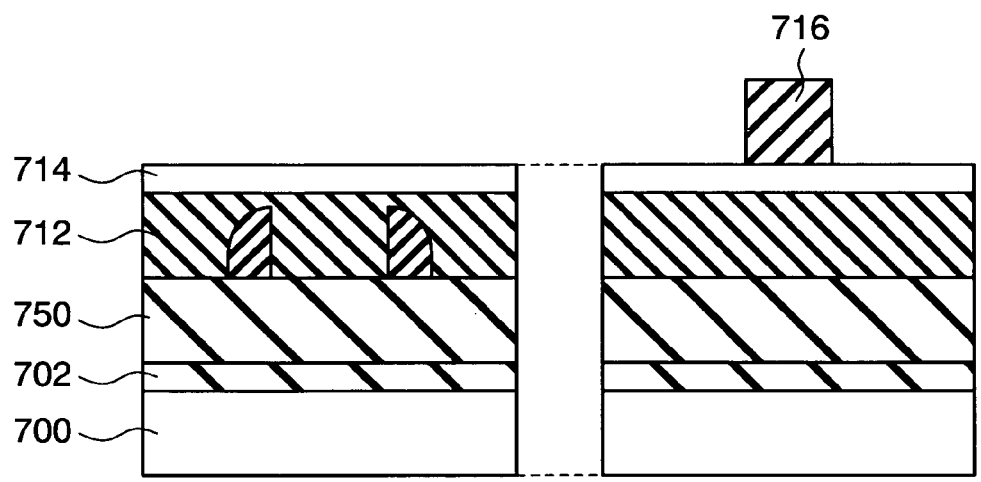
FIG. 58 is a sectional view for explaining the manufacturing process of the semiconductor device in the tenth embodiment.

Subsequently, as shown in FIG. 58, the anti-reflective coating (ARC) 714 to prevent the reflection of light is formed on the base film 712. Then, a photoresist is formed on the anti-reflective coating 714, and by patterning this photoresist by photolithography, the resist pattern 716 is formed. In this embodiment, the width of this resist pattern 716 is formed wider than the width of the sidewall 752.

Figure 59:
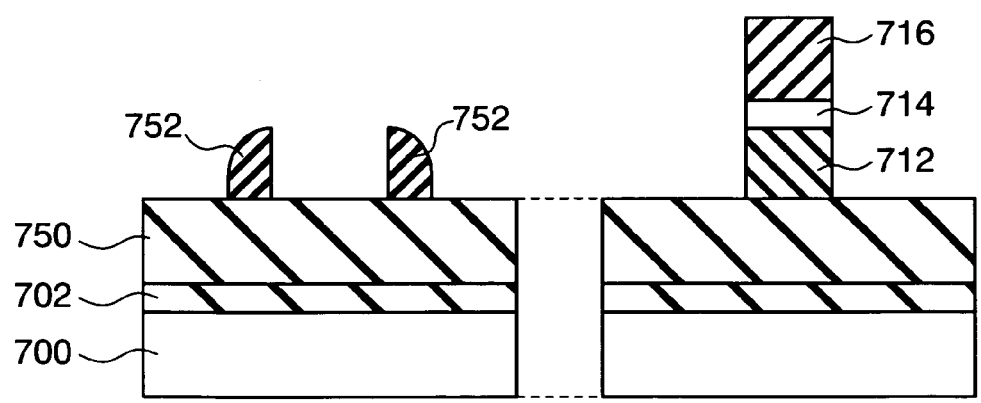
FIG. 59 is a sectional view for explaining the manufacturing process of the semiconductor device in the tenth embodiment.

Thereafter, as shown in FIG. 59, the base film 712 is etched by RIE with the resist pattern 716 as a mask. At this time, the sidewall 752 formed earlier is exposed. Then, the resist pattern 716 is removed.

Figure 60:
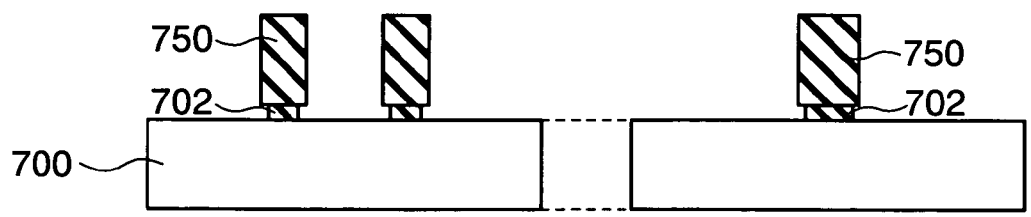
FIG. 60 is a sectional view for explaining the manufacturing process of the semiconductor device in the tenth embodiment.

Next, as shown in FIG. 60, the TEOS film 750 is etched by RIE with both the sidewall 752 and the base film 712 as a mask. Subsequently, the sidewall 752 and the base film 712 are removed by wet etching or the like.

Figure 61:
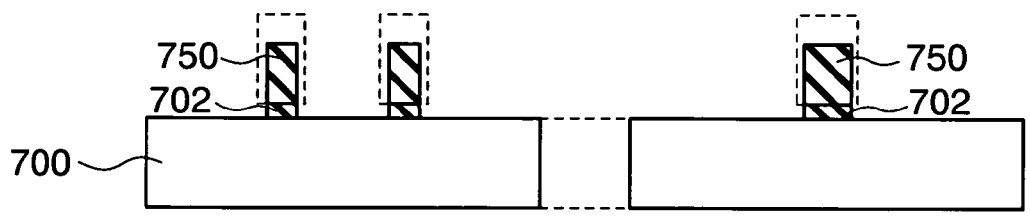
FIG. 61 is a sectional view for explaining the manufacturing process of the semiconductor device in the tenth embodiment.
Figure 62:
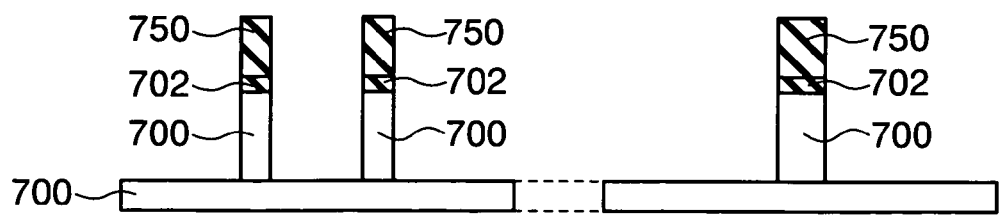
FIG. 62 is a sectional view for explaining the manufacturing process of the semiconductor device in the tenth embodiment.

Then, as shown in FIG. 61, the TEOS film 750 is thinned by etching with HF or the like. Thereafter, as shown in FIG. 62, the semiconductor substrate 700 is patterned by RIE.

As described above, a combination of materials in this embodiment can be selected in various ways. Namely, it is possible to combine various materials while ensuring a selective ratio at the time of etching. Moreover, even where the stopper portion 722 is formed as in the ninth embodiment, a combination of various materials including a material for the stopper portion 722 can be selected.

Eleventh Embodiment

In this embodiment, the base film 712 which is formed from amorphous silicon in the aforementioned tenth embodiment is formed from an SOG film (coating film). A step-by-step explanation of a manufacturing process will be given below.

Figure 63:
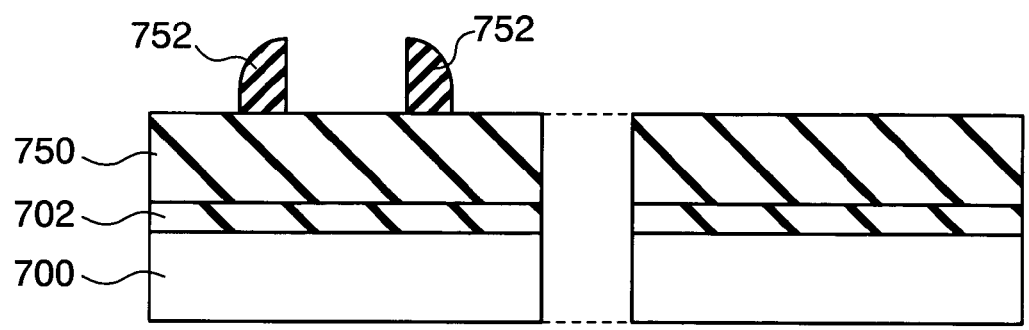
FIG. 63 is a sectional view for explaining a manufacturing process of a semiconductor device in an eleventh embodiment.
Figure 64:
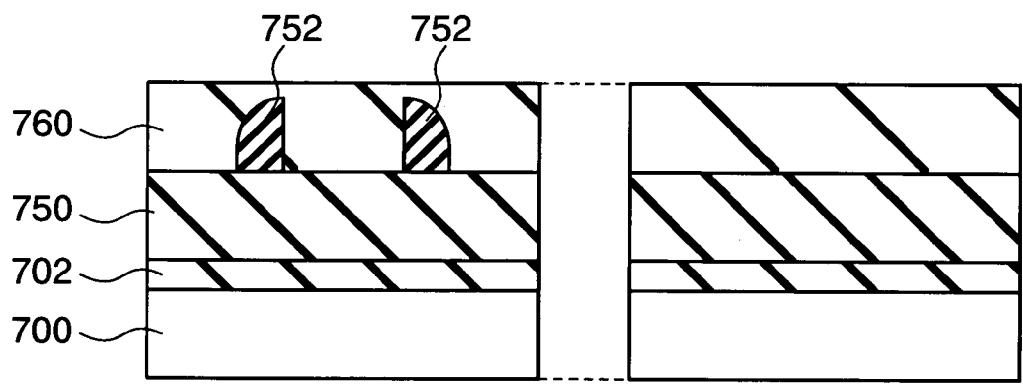
FIG. 64 is a sectional view for explaining the manufacturing process of the semiconductor device in the eleventh embodiment.

In this embodiment, the manufacturing process up to FIG. 63 is the same as in the aforementioned tenth embodiment. Following FIG. 63, in this embodiment, as shown in FIG. 64, SOG which is a material different from that for the sidewall 752 which is formed from nitride silicon is applied. By applying the SOG, the surface of the SOG is planarized, and thereby this is used as a base film 760.

Figure 65:
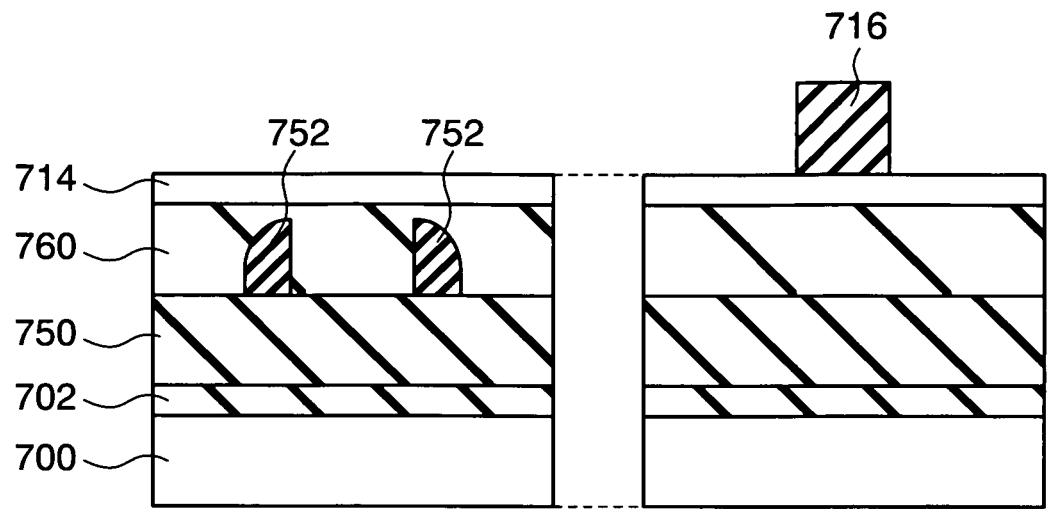
FIG. 65 is a sectional view for explaining the manufacturing process of the semiconductor device in the eleventh embodiment.

Then, as shown in FIG. 65, the anti-reflective coating (ARC) 714 to prevent the reflection of light is formed on the base film 760. Then, a photoresist is formed on the anti-reflective coating 714, and by patterning this photoresist by photolithography, the resist pattern 716 is formed. In this embodiment, the width of this resist pattern 716 is formed wider than the width of the sidewall 752.

Figure 66:
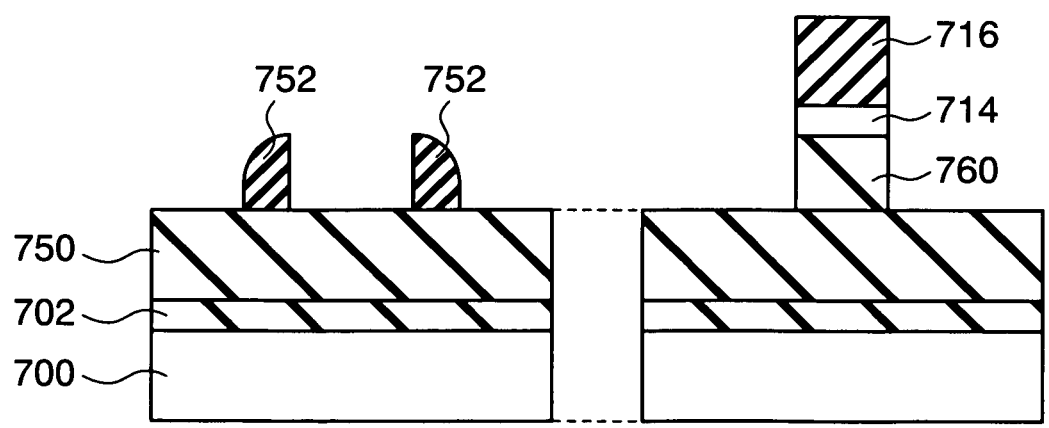
FIG. 66 is a sectional view for explaining the manufacturing process of the semiconductor device in the eleventh embodiment.

Thereafter, as shown in FIG. 66, the base film 760 is etched by RIE with the resist pattern 716 as a mask. At this time, the sidewall 752 formed earlier is exposed.

Figure 67:
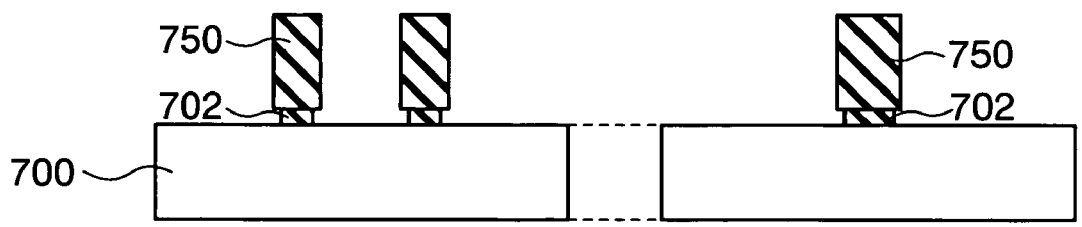
FIG. 67 is a sectional view for explaining the manufacturing process of the semiconductor device in the eleventh embodiment.

Next, as shown in FIG. 67, the TEOS film 750 is etched by RIE with both the sidewall 752 and the base film 760 as a mask. Subsequently, the sidewall 752 and the base film 760 are removed by wet etching or the like.

Figure 68:
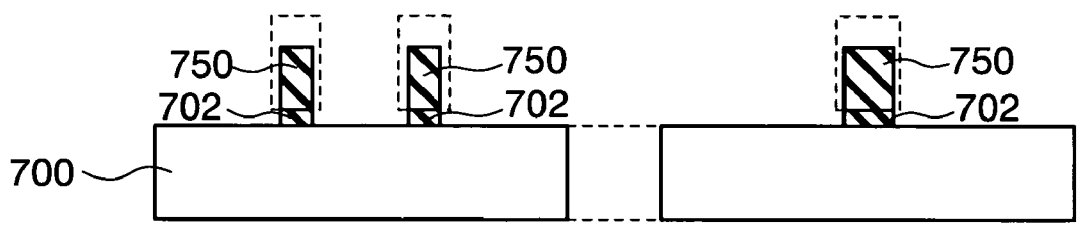
FIG. 68 is a sectional view for explaining the manufacturing process of the semiconductor device in the eleventh embodiment.
Figure 69:
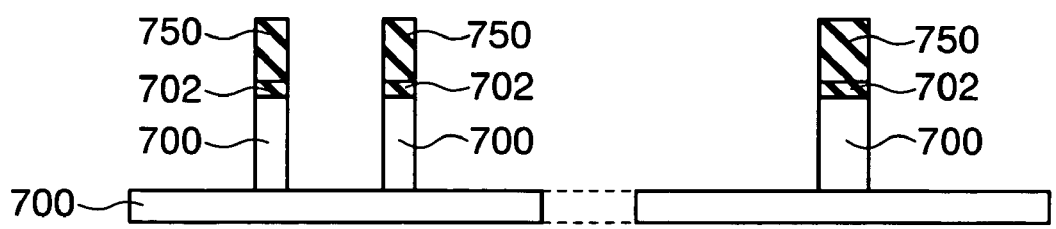
FIG. 69 is a sectional view for explaining the manufacturing process of the semiconductor device in the eleventh embodiment.

Then, as shown in FIG. 68, the TEOS film 750 is thinned by etching with HF or the like. Thereafter, as shown in FIG. 69, the semiconductor substrate 700 is fabricated by RIE.

As described above, also in this embodiment, by the pattern transfer of the sidewall 752 formed from SiN, microfabrication which is finer than the limit of photolithography can be performed and a silicon pattern whose line edge roughness (LER) is small can be formed.

Moreover, the base film 760 is formed by applying SOG which is liquid, whereby a polishing process for planarizing the surface can be omitted.

It should be mentioned that the present invention is not limited to the aforementioned embodiments, and various changes can be made therein. For example, in the aforementioned embodiments, the semiconductor substrate 700 composed of silicon is used, but a germanium substrate or a silicon germanium substrate may be used as the semiconductor substrate.

What is claimed is:

1. A method of manufacturing a semiconductor device comprising:
   forming a convex first protrusion;
   forming a first film;
   forming a mask portion on the first film;
   etching the first film with the mask portion as a mask; and
   forming a convex second protrusion which is higher than the first protrusion,
   wherein the step of forming the first film comprises:
      forming the first film such that a surface of the first film is higher than the first protrusion and lower than the second protrusion, and
   wherein the step of forming the mask portion comprises:
      forming a second film on the first film and the second protrusion which protrudes from the surface of the first film; and
      leaving the second film on a side surface of the second protrusion by etching back the second film so as to be used as the mask portion.

2. The manufacturing method of the semiconductor device according to claim 1, wherein the second protrusion is a gate electrode, a sidewall made of the first film being formed on a side surface of the gate electrode, and the first protrusion is a convex semiconductor portion, the sidewall being not formed on a side surface of the convex semiconductor portion.

3. The manufacturing method of the semiconductor device according to claim 2, further comprising:
   doping the convex semiconductor portion with impurities; and
   forming silicide in the convex semiconductor portion.

4. The manufacturing method of the semiconductor device according to claim 2, further comprising forming silicide in the convex semiconductor portion.

5. A method of manufacturing a semiconductor device, comprising:
   forming a convex first protrusion;
   forming a first film having a surface that is higher than the first protrusion;
   forming a mask portion on the first film;
   etching the first film with the mask portion as a mask; and
   forming a second film on a semiconductor substrate,
   wherein the step of forming the first protrusion comprises:
      forming a dummy pattern on the second film;
      forming a third film on the second film and the dummy pattern; and
      leaving the third film on a side surface of the dummy pattern by etching back the third film so as to form the first protrusion.

6. The manufacturing method of the semiconductor device according to claim 5, wherein the step of forming the mask portion comprises:
   forming an anti-reflective coating to prevent reflection of light on the first film;
   forming a photoresist on the anti-reflective coating; and
   patterning the photoresist by photolithography to form the mask portion.

7. The manufacturing method of the semiconductor device according to claim 6, further comprising etching the second film with the first protrusion as a mask.

8. The manufacturing method of the semiconductor device according to claim 7, further comprising removing the dummy pattern after forming the first protrusion and before forming the first film.

9. The manufacturing method of the semiconductor device according to claim 7, wherein the first film is formed without the dummy pattern being removed after the first protrusion is formed.

10. The manufacturing method of the semiconductor device according to claim 9, wherein the dummy pattern is removed together with the first film in the step of etching the first film.

11. The manufacturing method of the semiconductor device according to claim 5, further comprising:
    forming a stopper portion on the dummy pattern; and
    planarizing the first film by polishing the first film with the stopper portion as a stopper.

12. The manufacturing method of the semiconductor device according to claim 5, wherein the first film is formed by applying a liquid.

13. The manufacturing method of the semiconductor device according to claim 12, wherein the first film is an SOG film.

14. A method of manufacturing a semiconductor device, comprising:
   forming a convex first protrusion;
   forming a first film having a flat surface which is higher than the first protrusion;
   forming a mask portion on the flat surface of the first film;
   etching the first film, using the mask portion as a mask; and
   forming a convex second protrusion which is higher than the first protrusion,
   wherein the step of forming the first film comprises forming the first film such that the flat surface of the first film is higher than the first protrusion and lower than the second protrusion.

* * * * *